United States Patent
Ishii et al.

(10) Patent No.: US 10,458,020 B2
(45) Date of Patent: Oct. 29, 2019

(54) SUBSTRATE PROCESSING APPARATUS AND SUBSTRATE PROCESSING METHOD

(71) Applicant: Ebara Corporation, Tokyo (JP)

(72) Inventors: Yu Ishii, Tokyo (JP); Fong-Jie Du, Tokyo (JP); Makoto Kashiwagi, Tokyo (JP)

(73) Assignee: Ebara Corporation, Tokyo (JP)

( * ) Notice: Subject to any disclaimer, the term of this patent is extended or adjusted under 35 U.S.C. 154(b) by 465 days.

(21) Appl. No.: 15/095,330

(22) Filed: Apr. 11, 2016

(65) Prior Publication Data

US 2016/0305022 A1     Oct. 20, 2016

(30) Foreign Application Priority Data

Apr. 14, 2015   (JP) ................................. 2015-082882
Feb. 25, 2016   (JP) ................................. 2016-034548

(51) Int. Cl.
    *H01L 21/68*       (2006.01)
    *B24B 9/06*        (2006.01)
           (Continued)

(52) U.S. Cl.
    CPC .......... *C23C 16/4584* (2013.01); *C23C 16/52* (2013.01); *H01L 21/68* (2013.01);
           (Continued)

(58) Field of Classification Search
    CPC ..... H01L 21/68; H01L 21/304; H01L 21/677; H01L 21/67046; C23C 16/4584; C23C 16/52; B24B 21/002; B25B 11/00
    See application file for complete search history.

(56) References Cited

U.S. PATENT DOCUMENTS 4,457,664 A    7/1984   Judell et al.
5,125,791 A    6/1992   Volovich
                 (Continued)

FOREIGN PATENT DOCUMENTS

CN       102581755 A    7/2012
CN       103472680 A    12/2013
                (Continued)

OTHER PUBLICATIONS

European Patent Office, Extended European Search Report in European Patent Application No. 16164777.1 (dated Sep. 6, 2016).

*Primary Examiner* — Monica S Carter
*Assistant Examiner* — Mahdi H Nejad
(74) *Attorney, Agent, or Firm* — Leydig, Voit & Mayer, Ltd.

(57) ABSTRACT

There is disclosed a substrate processing apparatus which can align a center of a substrate, such as a wafer, with a central axis of a substrate stage with high accuracy. The substrate processing apparatus includes: an eccentricity detector configured to obtain an amount of eccentricity and an eccentricity direction of a center of the substrate, when held on a centering stage, from a central axis of the centering stage; and an aligner configured to perform a centering operation of moving and rotating the centering stage until the center of the substrate on the centering stage is located on a central axis of a processing stage. The aligner is configured to calculate a distance by which the centering stage is to be moved and an angle through which the centering stage is to be rotated, based on an initial relative position of the central axis of the centering stage with respect to the central axis of the processing stage, the amount of eccentricity, and the eccentricity direction.

12 Claims, 23 Drawing Sheets

(51) Int. Cl.
   *C23C 16/458* (2006.01)
   *C23C 16/52* (2006.01)
   *B24B 21/00* (2006.01)
   *B24B 37/30* (2012.01)
   *B24B 37/005* (2012.01)

(52) U.S. Cl.
   CPC ............ *B24B 9/065* (2013.01); *B24B 21/002* (2013.01); *B24B 37/005* (2013.01); *B24B 37/30* (2013.01); *H01L 21/681* (2013.01)

(56) References Cited

U.S. PATENT DOCUMENTS

| | | | | |
|---|---|---|---|---|
| 6,162,008 | A * | 12/2000 | Perkins | G01B 11/24 198/394 |
| 6,485,531 | B1 | 11/2002 | Schöb | |
| 6,489,626 | B2 * | 12/2002 | van der Muehlen | H01L 21/681 250/559.29 |
| 6,702,865 | B1 * | 3/2004 | Ozawa | H01L 21/67775 29/25.01 |
| 8,601,703 | B2 | 12/2013 | Makiuchi et al. | |
| 9,248,545 | B2 * | 2/2016 | Seki | B24B 37/10 |
| 2012/0244787 | A1 * | 9/2012 | Seki | B24B 9/065 451/303 |
| 2013/0255407 | A1 * | 10/2013 | Chilese | G03F 7/70691 73/865.8 |
| 2017/0345696 | A1 * | 11/2017 | Wang | H01L 21/67706 |
| 2017/0372933 | A1 * | 12/2017 | Kim | H01L 21/67742 |
| 2018/0076043 | A1 * | 3/2018 | Ito | B24B 37/00 |

FOREIGN PATENT DOCUMENTS

| | | | |
|---|---|---|---|
| JP | H1126556 A | * | 6/1997 |
| JP | 10-223727 | | 8/1998 |
| JP | 2001-057380 A | | 2/2001 |
| JP | 2001-230303 | | 8/2001 |
| JP | 2010-182966 | | 8/2010 |
| JP | 2010-186863 | | 8/2010 |
| JP | 4772679 | | 7/2011 |
| JP | 2012-209361 | | 10/2012 |
| JP | 2013-055277 | | 3/2013 |
| JP | 2013-111714 | | 6/2013 |
| JP | 5267918 | * | 8/2013 |
| JP | 2018083258 | * | 11/2016 |
| JP | 6046007_B2 I | * | 12/2016 |
| WO | WO03043077 | * | 5/2003 |
| WO | WO2009104568 | * | 1/2006 |
| WO | WO 2010/073817 A1 | | 7/2010 |
| WO | WO_03012848 | * | 2/2013 |
| WO | WO_2016199224 | * | 12/2016 |

* cited by examiner $a < 0$
$180° \leq \beta - \theta < 360°$ $a < 0$
$0° \leq \beta - \theta < 180°$ $a=0$, $\theta=90°$
$0° \leq \beta < 180°$ $a=0$, $\theta=90°$
$180° \leq \beta < 360°$ $a=0, \quad \theta=-90°$
$0° \leq \beta < 180°$ $a=0, \quad \theta=-90°$
$180° \leq \beta < 360°$

*FIG. 39* - Prior Art

FIG. 40 - Prior Art
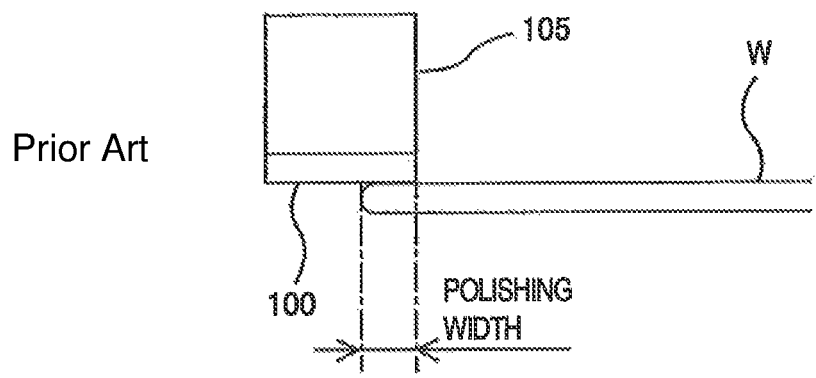
FIG. 41 - Prior Art
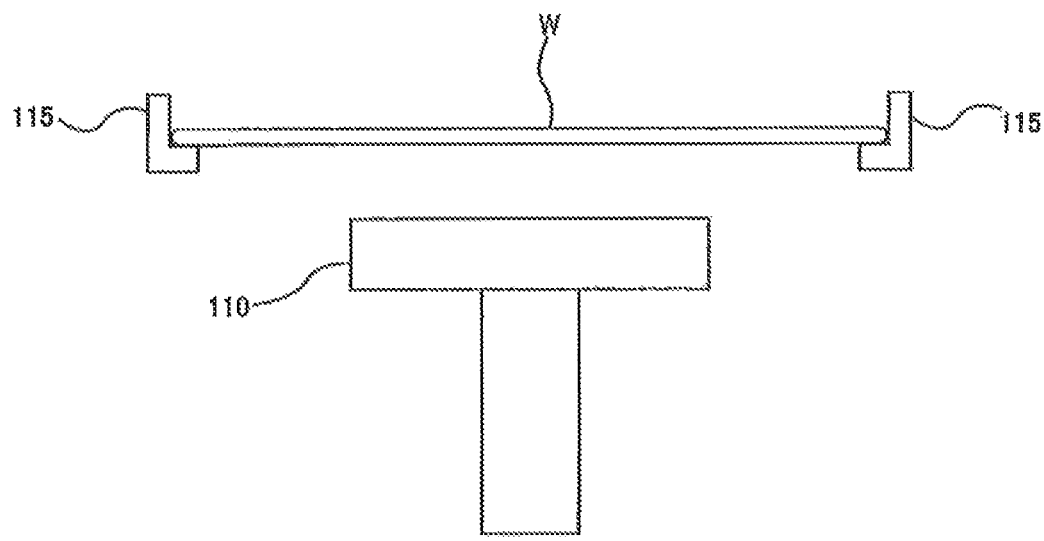

SUBSTRATE PROCESSING APPARATUS AND SUBSTRATE PROCESSING METHOD

CROSS REFERENCE TO RELATED APPLICATION

This document claims priorities to Japanese Patent Application Number 2015-082882 filed Apr. 14, 2015 and Japanese Patent Application Number 2016-034548 filed Feb. 25, 2016, the entire contents of which are hereby incorporated by reference.

BACKGROUND

A polishing apparatus having a polishing tool, such as a polishing tape or a whetstone, is used as an apparatus for polishing a peripheral portion of a substrate, such as a wafer. FIG. 39 is a schematic view of a polishing apparatus of this type. As shown in FIG. 39, the polishing apparatus includes a substrate stage 110 for holding a central portion of a wafer W by vacuum suction and rotating the wafer W, and a polishing head 105 for pressing a polishing tool 100 against a peripheral portion of the wafer W. The wafer W is rotated together with the substrate stage 110 while the polishing head 105 presses the polishing tool 100, whose lower surface (polishing surface) is parallel to a surface of the wafer W, against a peripheral portion of the wafer W, thereby polishing the peripheral portion of the wafer W. A polishing tape or a whetstone may be used as the polishing tool 100.

As shown in FIG. 40, a width of a portion, to be polished by the polishing tool 100, of the wafer W (hereinafter referred to as a polishing width) is determined by a relative position of the polishing tool 100 with respect to the wafer W. The polishing width is typically a few millimeters from an outermost perimeter of the wafer W. In order to polish a peripheral portion of the wafer W with a constant polishing width, it is necessary to align the center of the wafer W with the central axis of the substrate stage 110. Therefore, before the wafer W is placed on the substrate stage 110, centering of the wafer W is performed by holding the wafer W with centering hands 115 as shown in FIG. 41. The centering hands 115 approach the wafer W, which has been transported by a transport robot (not shown), from both sides of the wafer W until the centering hands 115 come into contact with edge portion of the wafer W, thus holding the wafer W. The relative position between the centering hands 115 and the substrate stage 110 is fixed such that the center of the wafer W, held by the centering hands 115, is located on the central axis of the substrate stage 110.

Such a conventional centering mechanism, however, has a limitation in an accuracy of wafer centering. This may result in unstable polishing width. Further, it is possible that the accuracy of wafer centering may decrease due to wear of the centering hands 115. In addition, when the polishing tool 100 is pressed against the peripheral portion of the wafer W, the entirety of the wafer W may warp and a defect may occur in the peripheral portion of the wafer W. In order to prevent such warp of the wafer W, a support stage (not shown), which is provided separately from the substrate stage 110, may be used to support a peripheral area of the lower surface of the wafer W. However, the wafer W will warp if a substrate supporting surface of the substrate stage 110 and a substrate supporting surface of the support stage do not lie in the same plane.

SUMMARY OF THE INVENTION

According to embodiments, there are provided a substrate processing apparatus and a substrate processing method which can align a center of a substrate, such as a wafer, with a central axis of a substrate stage with high accuracy.

Embodiments, which will be described below, relate to a substrate processing apparatus and a substrate processing method which are applicable to a polishing apparatus and a polishing method for polishing a peripheral portion of a substrate, such as a wafer.

In an embodiment, there is provided a substrate processing apparatus comprising: a centering stage configured to hold a first area of a lower surface of a substrate; a processing stage configured to hold a second area of the lower surface of the substrate; a stage elevating mechanism configured to move the centering stage between an elevated position higher than the processing stage and a lowered position lower than the processing stage; a processing-stage rotating mechanism configured to rotate the processing stage about its central axis; an eccentricity detector configured to obtain an amount of eccentricity and an eccentricity direction of a center of the substrate, when held on the centering stage, from a central axis of the centering stage; and an aligner configured to perform a centering operation of moving and rotating the centering stage until the center of the substrate on the centering stage is located on the central axis of the processing stage, the aligner being configured to calculate a distance by which the centering stage is to be moved and an angle through which the centering stage is to be rotated, based on an initial relative position of the central axis of the centering stage with respect to the central axis of the processing stage, the amount of eccentricity, and the eccentricity direction.

In an embodiment, the aligner includes: a moving mechanism configured to move the centering stage along a predetermined offset axis until a distance between the central axis of the centering stage and the central axis of the processing stage becomes equal to the amount of eccentricity; and a centering-stage rotating mechanism configured to rotate the centering stage until the center of the substrate on the centering stage is located on a straight line which extends through the central axis of the processing stage and extends parallel to the predetermined offset axis.

In an embodiment, the moving mechanism and the centering-stage rotating mechanism are configured to simultaneously move and rotate the centering stage.

In an embodiment, if the distance between the central axis of the processing stage and the central axis of the centering stage is longer than a distance between the central axis of the centering stage and the center of the substrate, the stage elevating mechanism lowers the centering stage to transfer the substrate from the centering stage to the processing stage, the processing-stage rotating mechanism rotates the processing stage 180 degrees together with the substrate, and then the stage elevating mechanism elevates the centering stage to transfer the substrate from the processing stage to the centering stage.

In an embodiment, the aligner is configured to move and rotate the centering stage until a distance between the center of the substrate on the centering stage and the central axis of the processing stage reaches a minimum, if the amount of eccentricity is larger than a maximum distance that the moving mechanism can move the centering stage along the predetermined offset axis.

In an embodiment, the aligner stores in advance a movement direction of the centering stage which can minimize a time to complete the centering operation, the movement direction being determined in advance based on a positional relationship between the central axis of the centering stage, the central axis of the processing stage and the center of the substrate on the centering stage.

In an embodiment, the aligner is configured to move the centering stage only in one direction and to rotate the centering stage only in one direction in the centering operation.

In an embodiment, there is provided a substrate processing method comprising: holding a first area of a lower surface of a substrate with a centering stage; obtaining an amount of eccentricity and an eccentricity direction of a center of the substrate, when held on the centering stage, from a central axis of the centering stage; calculating a distance by which the centering stage is to be moved and an angle through which the centering stage is to be rotated, based on an initial relative position of the central axis of the centering stage with respect to a central axis of a processing stage, the amount of eccentricity, and the eccentricity direction, the distance and the angle to be calculated being a distance and an angle necessary for the center of the substrate to be located on the central axis of the processing stage; performing a centering operation of moving the centering stage by the calculated distance and rotating the centering stage through the calculated angle; holding a second area of the lower surface of the substrate with the processing stage, while separating the centering stage from the substrate; and processing the substrate while rotating the processing stage about its central axis.

In an embodiment, the centering operation includes: an operation of moving the centering stage along a predetermined offset axis until a distance between the central axis of the centering stage and the central axis of the processing stage becomes equal to the amount of eccentricity; and an operation of rotating the centering stage until the center of the substrate on the centering stage is located on a straight line which extends through the central axis of the processing stage and extends parallel to the predetermined offset axis.

In an embodiment, the operation of moving the centering stage along the predetermined offset axis and the operation of rotating the centering stage are performed simultaneously.

In an embodiment, the substrate processing method further comprises: if the distance between the central axis of the processing stage and the central axis of the centering stage is longer than a distance between the central axis of the centering stage and the center of the substrate, lowering the centering stage to transfer the substrate from the centering stage to the processing stage; rotating the processing stage 180 degrees together with the substrate; and then elevating the centering stage to transfer the substrate from the processing stage to the centering stage.

In an embodiment, if the amount of eccentricity is larger than a maximum distance that the centering stage can be moved along the predetermined offset axis, the centering stage is moved and rotated until a distance between the center of the substrate on the centering stage and the central axis of the processing stage reaches a minimum.

In an embodiment, the centering stage is moved in a direction which can minimize a time to complete the centering operation, and the direction in which the centering stage is moved is determined in advance based on a positional relationship between the central axis of the centering stage, the central axis of the processing stage and the center of the substrate on the centering stage.

In an embodiment, the centering stage is moved only in one direction and rotated only in one direction in the centering operation.

In general, in order to align a center of a substrate with the central axis of the processing stage by using the centering stage, it is preferable that the central axis of the centering stage completely coincide with the central axis of the processing stage. However, due to accuracy of assembly of parts of the polishing apparatus, mechanical dimensional error, etc., it is very difficult to make the central axis of the centering stage completely coincide with the central axis of the processing stage. According to the above-described embodiments, centering of a substrate can be performed even under a condition that the central axis of the centering stage does not coincide with the central axis of the processing stage. Specifically, a distance by which the centering stage is to be moved and an angle through which the centering stage is to be rotated are calculated based on the initial relative position of the central axis of the centering stage with respect to the central axis of the processing stage, and on the amount of eccentricity of the center of the substrate from the central axis of the centering stage. Further, after the processing stage holds the second area (in particular a peripheral area) of a lower surface of a substrate, the centering stage can be detached from the substrate. Therefore, the substrate can be processed without warping while only the processing stage is holding the second area of the lower surface of the substrate.

BRIEF DESCRIPTION OF THE DRAWINGS

FIG. 39 is a schematic view of a conventional polishing apparatus;

FIG. 40 is a diagram illustrating a polishing width of a wafer; and

FIG. 41 is a schematic view of a conventional polishing apparatus provided with centering hands.

DESCRIPTION OF EMBODIMENTS

Embodiments will now be described with reference to the drawings. Below-described embodiments of a substrate processing apparatus and a substrate processing method invention relate to a polishing apparatus and a polishing method for polishing a peripheral portion of a substrate.

Figure 1:
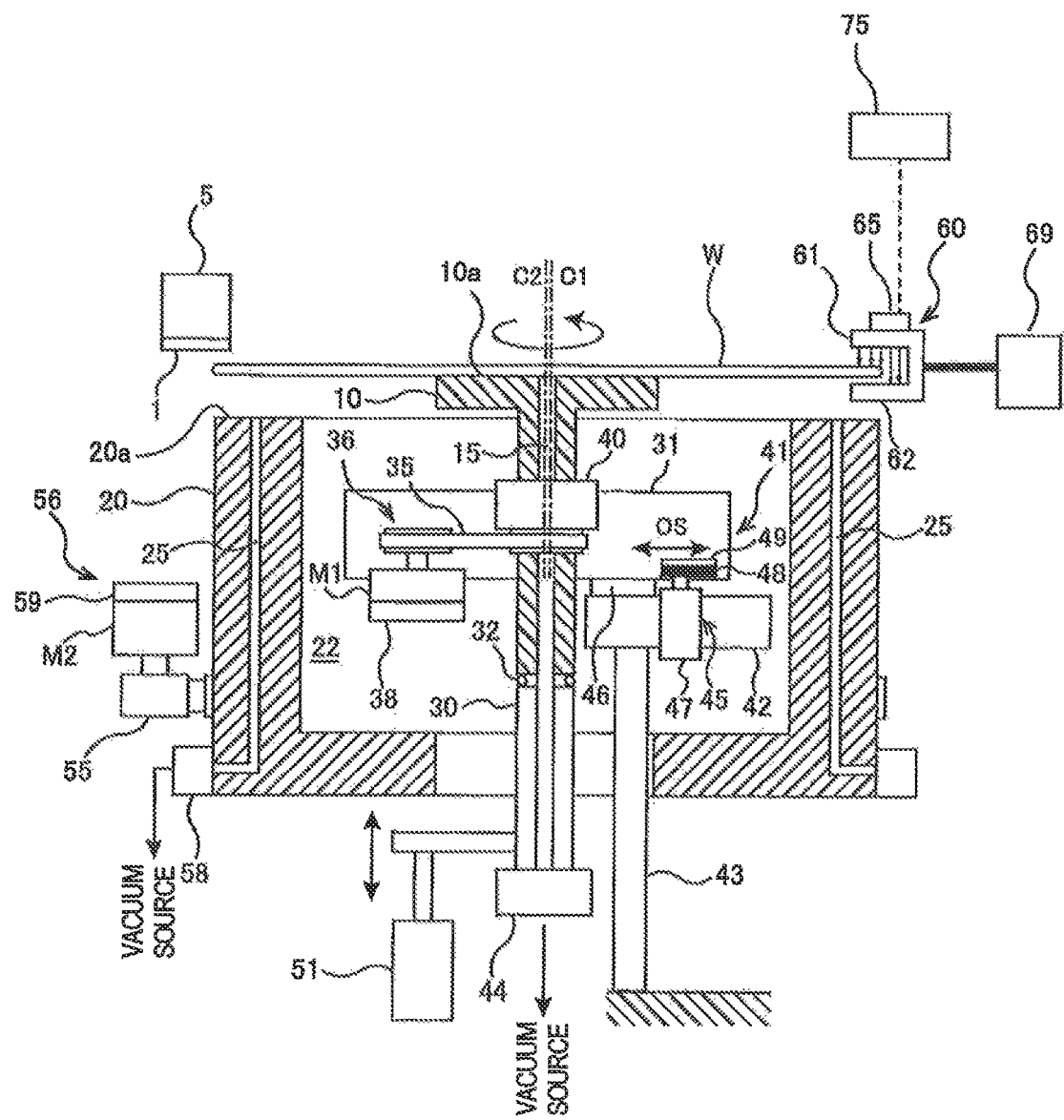
FIG. 1 is a schematic view of a polishing apparatus.

FIG. 1 is a schematic view of the polishing apparatus. As shown in FIG. 1, the polishing apparatus includes a centering stage 10 and a processing stage 20, both of which are configured to hold a wafer W which is an example of a substrate. The centering stage 10 is a stage for performing centering of the wafer W, and the processing stage 20 is a stage for polishing the wafer W. During centering of the wafer W, the wafer W is held only by the centering stage 10. During polishing of the wafer W, the wafer W is held only by the processing stage 20.

The processing stage 20 has a space 22 formed therein. The centering stage 10 is housed in the space 22 of the processing stage 20. The centering stage 10 has a first substrate holding surface 10a for holding a first area of a lower surface of the wafer W.

The processing stage 20 has a second substrate holding surface 20a for holding a second area of the lower surface of the wafer W. The first area and the second area are located at different positions in the lower surface of the wafer W. In this embodiment, the first substrate holding surface 10a has a circular shape, and is configured to hold a center-side area of the lower surface of the wafer W. The second substrate holding surface 20a has an annular shape, and is configured to hold a peripheral area of the lower surface of the wafer W. The center-side area is located inside the peripheral area. In this embodiment the center-side area is a circular area containing the central point of the wafer W, while the center-side area may be an annular area not containing the central point of the wafer W as long as the center-side area is located inside the peripheral area. The second substrate holding surface 20a is arranged so as to surround the first substrate holding surface 10a. A width of the annular second substrate holding surface 20a is, for example, in a range of 5 mm to 50 mm.

The centering stage 10 is coupled to a support shaft 30 via a bearing 32. The support shaft 30 is disposed below the centering stage 10. The bearing 32 is secured to an upper end of the support shaft 30, and rotatably supports the centering stage 10. The centering stage 10 is coupled to a motor M1 through a torque transmitting mechanism 35 which may be comprised of pulleys and a belt, so that the centering stage 10 can be rotated about its central axis. The motor M1 is secured to a coupling block 31. The motor M1 and the torque transmitting mechanism 35 constitute a centering-stage rotating mechanism 36 for rotating the centering stage 10 on its central axis C1. A rotary encoder 38 is coupled to the motor M1, so that an angle of rotation of the centering stage 10 is measured by the rotary encoder 38.

The centering stage 10 and the support shaft 30, in their interiors, are provided with a first vacuum line 15 extending in the axial direction of the centering stage 10 and the support shaft 30. The first vacuum line 15 is coupled to a vacuum source (not shown) through a rotary joint 44 secured to a lower end of the support shaft 30. The first vacuum line 15 has a top opening lying in the first substrate holding surface 10a. Therefore, when a vacuum is created in the first vacuum line 15, the center-side area of the wafer W is held on the first substrate holding surface 10a by vacuum suction.

The centering stage 10 is coupled to a stage elevating mechanism 51 through the support shaft 30. The stage elevating mechanism 51 is disposed below the processing stage 20 and coupled to the support shaft 30. The stage elevating mechanism 51 is capable of moving up and down the support shaft 30 and the centering stage 10 together.

The centering stage 10 is coupled to a moving mechanism 41 for moving the centering stage 10 along a predetermined horizontally-extending offset axis OS. The centering stage 10 is rotatably supported by a linear bearing 40, which is secured to the coupling block 31. The linear bearing 40 is configured to rotatably support the centering stage 10 while allowing vertical movement of the centering stage 10. A ball spline bearing, for example, can be used as the linear bearing 40.

The moving mechanism 41 includes the above-described coupling block 31, an actuator 45 for horizontally moving the centering stage 10, and a linear-motion guide 46 for restricting the horizontal movement of the centering stage 10 to horizontal movement along the above-described offset axis OS. This offset axis OS is an imaginary movement axis extending in a longitudinal direction of the linear-motion guide 46. The offset axis OS is shown by arrow in FIG. 1.

The linear-motion guide 46 is secured to a base 42. The base 42 is secured to a support arm 43, which is coupled to a stationary member, such as a frame of the polishing apparatus. The coupling block 31 is horizontally movably supported by the linear-motion guide 46. The actuator 45 includes an offset motor 47 secured to the base 42, an eccentric cam 48 mounted to a drive shaft of the offset motor 47, and a recess 49 which is formed in the coupling block 31 and in which the eccentric cam 48 is housed. When the offset motor 47 rotates the eccentric cam 48, the eccentric cam 48, while keeping in contact with the recess 49, moves the coupling block 31 horizontally along the offset axis OS.

When the actuator 45 is set in motion, the centering stage 10 is horizontally moved along the offset axis OS, with its movement direction being guided by the linear-motion guide 46. The position of the processing stage 20 is fixed. The moving mechanism 41 moves the centering stage 10 horizontally relative to the processing stage 20, while the stage elevating mechanism 51 moves the centering stage 10 vertically relative to the processing stage 20.

The centering stage 10, the centering-stage rotating mechanism 36 and the moving mechanism 41 are housed in the space 22 of the processing stage 20. This arrangement can allow a substrate holding section including the centering stage 10, the processing stage 20, etc. to be compact. Further, the processing stage 20 can protect the centering stage 10 from a polishing liquid (e.g. pure water or a liquid chemical) supplied to the surface of the wafer W during polishing of the wafer W.

The processing stage 20 is rotatably supported by a not-shown bearing. The processing stage 20 is coupled to a motor M2 through a torque transmitting mechanism 55 which may be comprised of pulleys and a belt, so that the processing stage 20 can be rotated about its central axis C2. A rotary encoder 59 is coupled to the motor M2, so that an angle of rotation of the processing stage 20 is measured by the rotary encoder 59. The motor M2 and the torque transmitting mechanism 55 constitute a processing-stage rotating mechanism 56 for rotating the processing stage 20 about its central axis C2.

An upper surface of the processing stage 20 constitutes the annular second substrate holding surface 20a. A plurality of second vacuum lines 25 are provided in the processing stage 20. These second vacuum lines 25 are each coupled to a vacuum source (not shown) through a rotary joint 58. The second vacuum lines 25 have top openings, respective, lying in the second substrate holding surface 20a. Therefore, when a vacuum is created in each second vacuum line 25, the peripheral area of the lower surface of the wafer W is held on the second substrate holding surface 20a by vacuum suction. The second substrate holding surface 20a has a diameter which is equal to or smaller than the diameter of the wafer W.

A polishing head 5 for pressing a polishing tool 1 against a peripheral portion of the wafer W is disposed above the second substrate holding surface 20a of the processing stage 20. The polishing head 5 is configured to be movable both in the vertical direction and in the radial direction of the wafer W. While keeping a lower surface (or a polishing surface) of the polishing tool 1 parallel to the upper surface of the wafer W, the polishing head 5 presses the polishing tool 1 downwardly against the peripheral portion of the rotating wafer W, thereby polishing the peripheral portion of the wafer W. A polishing tape or a whetstone can be used as the polishing tool 1.

Above the processing stage 20 is disposed an eccentricity detector 60 for measuring an amount of eccentricity of the center of the wafer W, held on the centering stage 10, from the central axis C1 of the centering stage 10. The eccentricity detector 60 is an optical eccentricity sensor, which includes a light emitting section 61 for emitting light, a light receiving section 62 for receiving the light, and a processing section 65 for determining the amount of eccentricity of the wafer W from an amount of light measured by the light receiving section 62. The eccentricity detector 60 is coupled to a lateral moving mechanism 69, so that the eccentricity detector 60 is movable in directions closer to and away from the peripheral portion of the wafer W.

The amount of eccentricity of the wafer W is measured in the following manner. The eccentricity detector 60 is moved closer to the peripheral portion of the wafer W until the peripheral portion of the wafer W lies between the light emitting section 61 and the light receiving section 62. While the wafer W is being rotated about the central axis C1 of the centering stage 10, the light is emitted from the light emitting section 61 toward the light receiving section 62. Part of the light is blocked by the wafer W, while the remainder of the light reaches the light receiving section 62.

Figure 2:
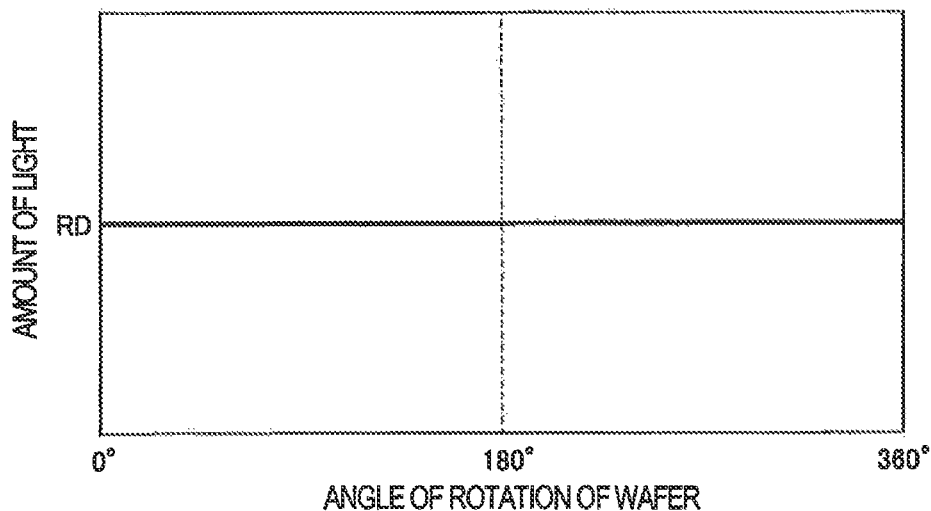
FIG. 2 is a graph showing an amount of light obtained during one revolution of a wafer.
Figure 3:
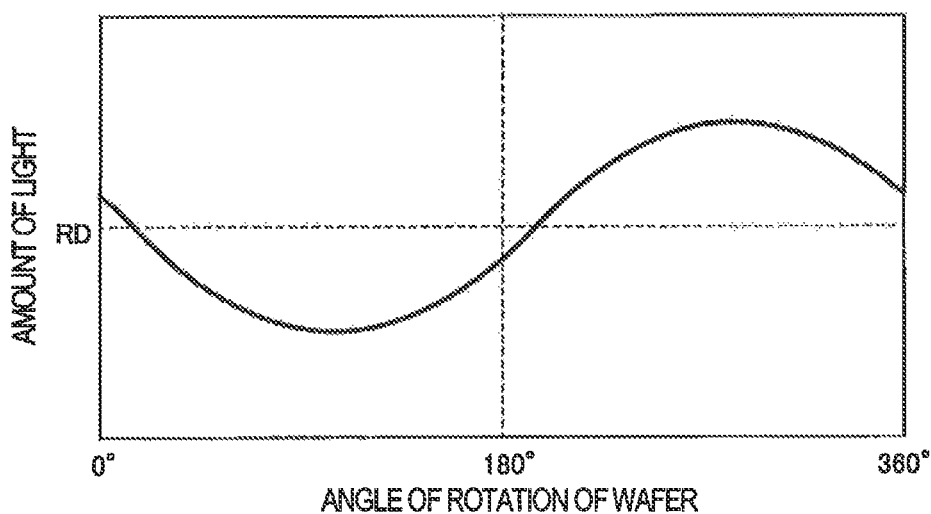
FIG. 3 is a graph showing an amount of light obtained during one revolution of a wafer.

The amount of light, measured by the light receiving section 62, changes depending on the relative position between the wafer W and the centering stage 10. If the center of the wafer W is on the central axis C1 of the centering stage 10, the amount of light, obtained during one revolution of the wafer W, is maintained at a predetermined reference light amount RD as shown in FIG. 2. In contrast, if the center of the wafer W is deviated from the central axis C1 of the centering stage 10, the amount of light, obtained during one revolution of the wafer W, changes with angle of rotation of the wafer W as shown in FIG. 3.

The amount of eccentricity of the wafer W is inversely proportional to the amount of light measured by the light receiving section 62. In other words, an angle of the wafer W at which the amount of light reaches its minimum is an angle at which the amount of eccentricity of the wafer W is a maximum. The reference light amount RD represents an amount of light which has been measured on a reference wafer (or a reference substrate) having a reference diameter (e.g. 300.00 mm) with is center lying on the central axis C1 of the centering stage 10. The reference light amount RD is stored in advance in the processing section 65. Further, data (e.g. a table or a relational expression) on a relationship between the amount of light and the amount of eccentricity of the wafer W from the central axis C1 of the centering stage 10 is stored in advance in the processing section 65. The amount of eccentricity corresponding to the reference light amount RD is 0. Based on the data, the processing section 65 determines the amount of eccentricity of the wafer W from a measured amount of light.

The processing section 65 of the eccentricity detector 60 is coupled to the rotary encoder 38. A signal indicating the angle of rotation of the centering stage 10 (i.e. the angle of rotation of the wafer W) is sent from the rotary encoder 38 to the processing section 65. The processing section 65 determines an angle of the wafer W at which the amount of light reaches its minimum. This angle indicates the eccentricity direction of the center of the wafer W from the central axis C1 of the centering stage 10. In this manner, the processing section 65 obtains the amount of eccentricity and the eccentricity direction of the center of the wafer W from the central axis C1 of the centering stage 10.

In this embodiment the eccentricity detector 60 is an optical eccentricity sensor, while other types of eccentricity detectors may be used. For example, a known eccentricity detector that employs the least-square method may be used. An eccentricity detector of this type is configured to generate an image of an entire periphery of a wafer, determine the center of the wafer based on an average of X-coordinates and an average of Y-coordinates of multiple coordinate points distributed at equal angular intervals on the periphery of the wafer, and determine the amount of eccentricity and the eccentricity direction of the center of the wafer from the central axis C1 of the centering stage 10.

In general, in order to align a center of a wafer with the central axis C2 of the processing stage 20 by using the centering stage 10, the central axis C1 of the centering stage 10 preferably fully coincides with the central axis C2 of the processing stage 20. However, due to accuracy of assembly of parts of the polishing apparatus, mechanical dimensional error, etc., it is very difficult to make the central axis C1 of the centering stage 10 completely coincide with the central axis C2 of the processing stage 20.

Thus, in this embodiment, a wafer centering operation is performed under a condition that the central axis C1 of the centering stage 10 does not coincide with the central axis C2 of the processing stage 20. First, in a preparatory operation for the centering operation, an initial relative position of the central axis C1 of the centering stage 10 with respect to the central axis C2 of the processing stage 20 is determined in the following manner.

Figure 4:
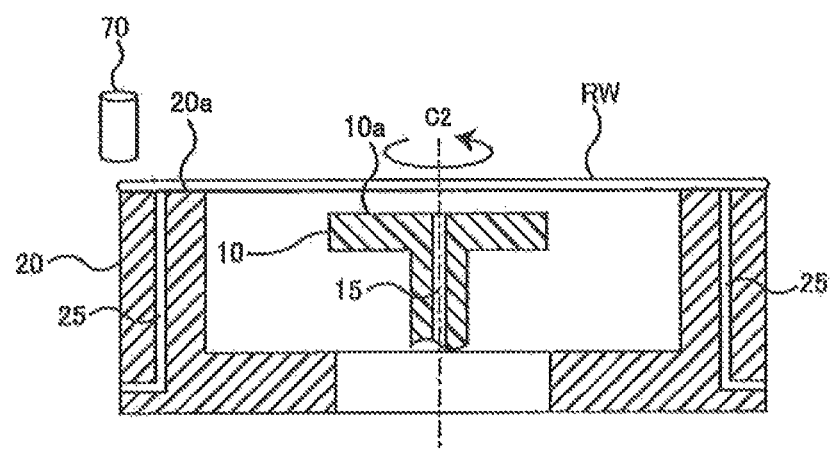
FIG. 4 is a schematic view of a polishing apparatus provided with an eccentricity detector for measuring an amount of eccentricity and an eccentricity direction of a center of a reference wafer from a central axis of a processing stage.

As shown in FIG. 4, the polishing apparatus is provided with an eccentricity detector 70 for measuring an eccentricity vector of a wafer placed on the processing stage 20, i.e. an amount of eccentricity and an eccentricity direction of the center of the wafer from the central axis C2 of the processing stage 20. The eccentricity detector 70 is removable, and is removed after completion of measurement of the eccentricity of the wafer on the processing stage 20. An eccentricity detector that employs the least-square method, described above, is used as the eccentricity detector 70.

Figure 5:
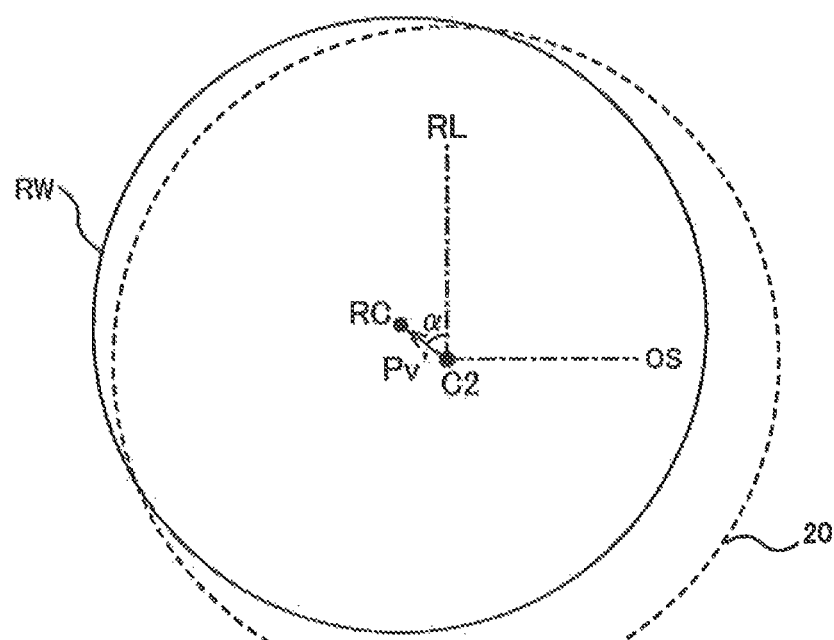
FIG. 5 is a diagram showing the amount of eccentricity and the eccentricity direction of the center of the reference wafer from the central axis of the processing stage.

Next, as shown in FIG. 4, a reference wafer (or a reference substrate) RW is placed on the processing stage 20. This reference wafer RW may be either a wafer to be polished or another wafer having the same size as a wafer to be polished. The reference wafer RW is held on the second substrate holding surface 20*a* of the processing stage 20 by vacuum suction as described above. The processing stage 20, together with the reference wafer RW held thereon, is forced to make one revolution by the processing-stage rotating mechanism 56 (see FIG. 1). As shown in FIG. 5, the eccentricity detector 70 calculates the amount of eccentricity and the eccentricity direction of a center RC of the reference wafer RW from the central axis C2 of the processing stage 20 by using the least-square method as described above, thus determining an eccentricity vector Pv'. The amount of eccentricity is a magnitude |Pv'| of the eccentricity vector Pv', and corresponds to a distance from the central axis C2 of the processing stage 20 to the center RC of the reference wafer RW. The eccentricity direction is represented by an angle a of the eccentricity vector Pv' with respect to an angle reference line RL which extends through the central axis C2 of the processing stage 20 and is perpendicular to the offset axis OS.

Figure 6:
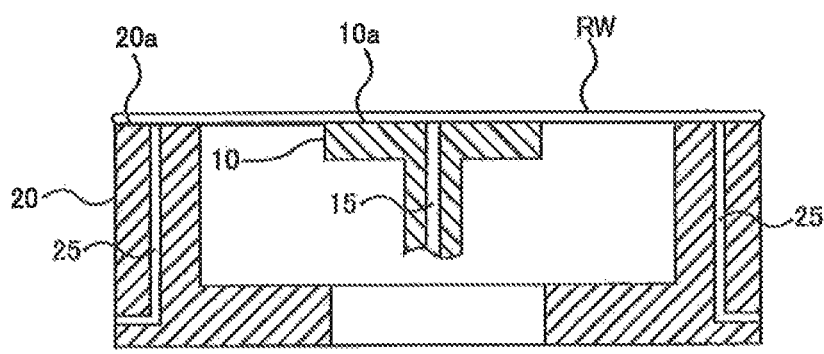
FIG. 6 is a diagram illustrating an operation of transferring the reference wafer from the processing stage to a centering stage.
Figure 7:
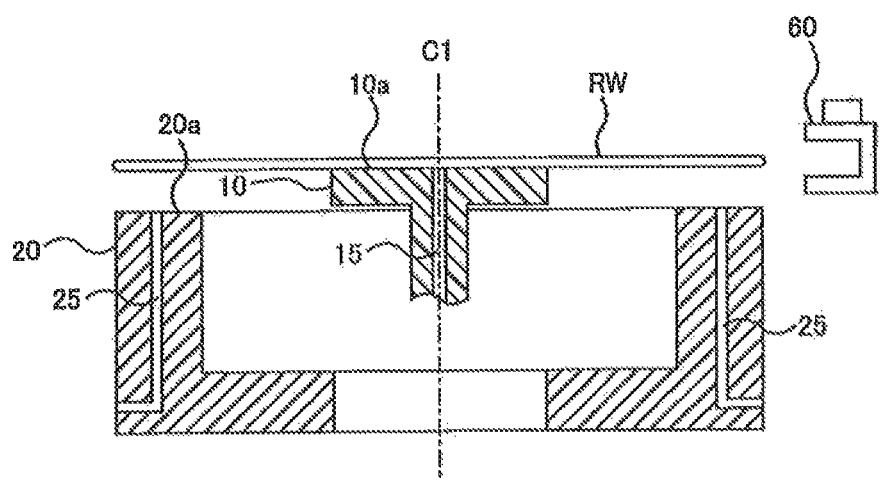
FIG. 7 is a diagram illustrating an operation of elevating the centering stage together with the reference wafer.

After the eccentricity vector Pv' is determined, the centering stage 10 is elevated until the first substrate holding surface 10*a* of the centering stage 10 is brought into contact with the center-side area of the lower surface of the reference wafer RW as shown in FIG. 6. A vacuum is then created in the first vacuum line 15, whereby the center-side area of the lower surface of the reference wafer RW is held on the centering stage 10 by vacuum suction. Thereafter, the second vacuum lines 25 are ventilated, so that the reference wafer RW can be separated from the processing stage 20. After the reference wafer RW is transferred from the processing stage 20 to the centering stage 10, the centering stage 10 is elevated together with the reference wafer RW until the reference wafer RW reaches the same height as the eccentricity detector 60.

Figure 8:
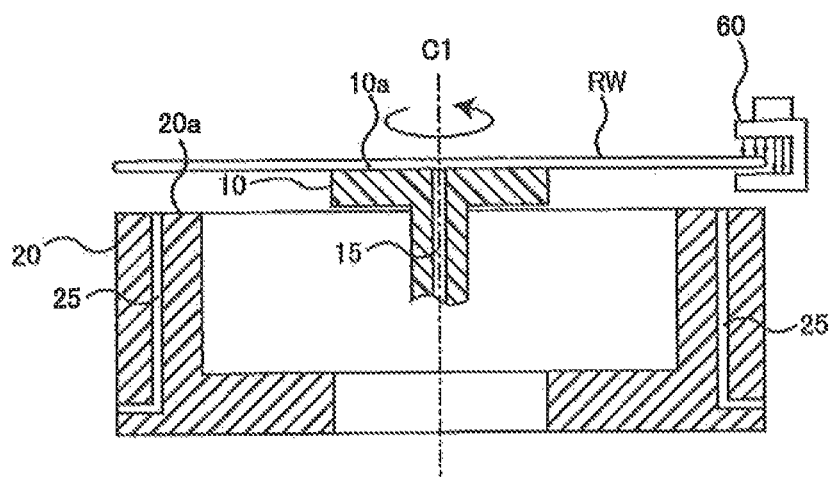
FIG. 8 is a diagram illustrating an operation of measuring the amount of eccentricity and the eccentricity direction of the center of the reference wafer from the central axis of the centering stage.
Figure 9:
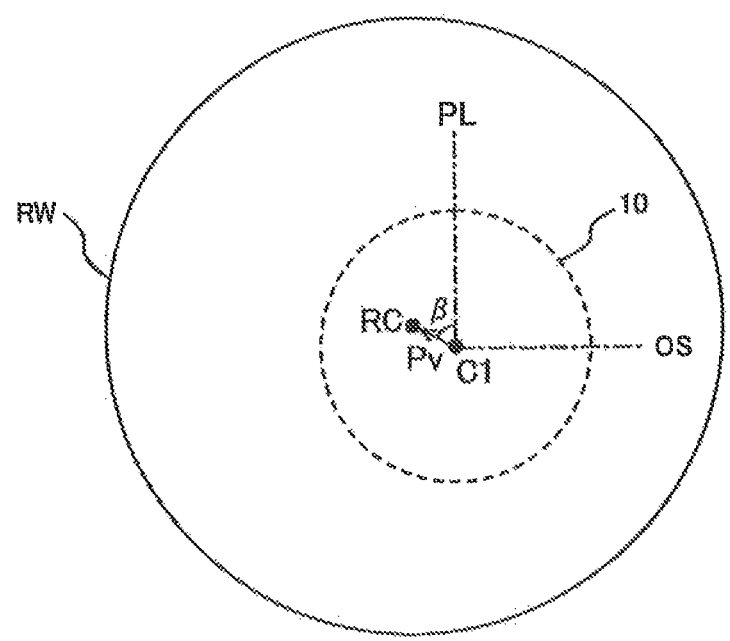
FIG. 9 is a diagram showing the amount of eccentricity and the eccentricity direction of the center of the reference wafer from the central axis of the centering stage.

As shown in FIG. 8, the centering stage 10, together with the reference wafer RW, is rotated about the central axis C1 of the centering stage 10. The eccentricity detector 60 approaches the rotating reference wafer RW and then measures the amount of eccentricity and the eccentricity direction of the center RC of the reference wafer RW from the central axis C1, as discussed above. As shown in FIG. 9, an eccentricity vector Pv of the center RC of the reference wafer RW from the central axis C1 of the centering stage 10 is determined. The amount of eccentricity is a magnitude |Pv| of the eccentricity vector Pv, and corresponds to a distance from the central axis C1 of the centering stage 10 to the center RC of the reference wafer RW. The eccentricity direction is represented by an angle β of the eccentricity vector Pv with respect to an angle reference line PL which extends through the central axis C1 of the centering stage 10 and is perpendicular to the offset axis OS. The angle reference line PL shown in FIG. 9 and the angle reference line RL shown in FIG. 5 are horizontal lines parallel to each other.

The eccentricity detector 60 and the eccentricity detector 70 are coupled to an operation controller 75 shown in FIG. 1. The amounts of eccentricity (|Pv'|, |Pv|) and the eccentricity directions (angle α, angle β), which specify the eccentricity vector Pv' and the eccentricity vector Pv, are sent to the operation controller 75. From the eccentricity vector Pv' and the eccentricity vector Pv, the operation controller 75 calculates the initial relative position of the central axis C1 of the centering stage 10 with respect to the central axis C2 of the processing stage 20.

Figure 10:
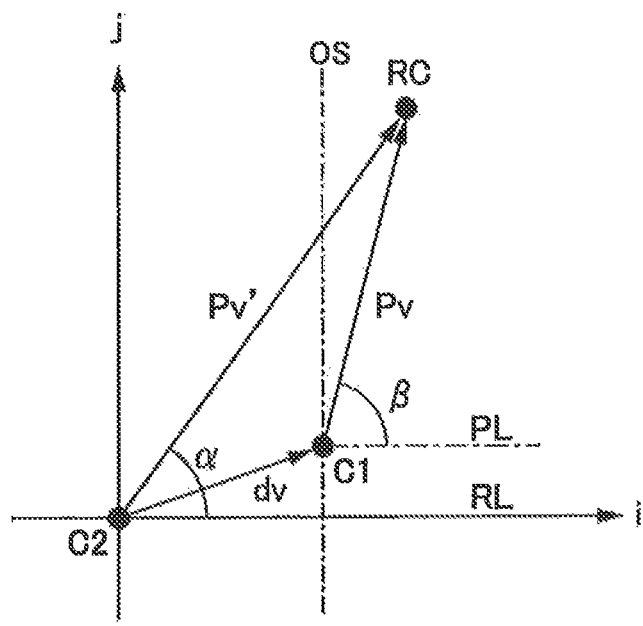
FIG. 10 is a diagram showing a positional relationship between the central axis of the centering stage, the central axis of the processing stage and the center of the reference wafer.

FIG. 10 is a diagram showing the eccentricity vector Pv' and the eccentricity vector Pv. The position of the reference wafer RW does not change when the reference wafer RW is transferred from the processing stage 20 to the centering stage 10. Accordingly, the position of the center RC of the reference wafer RW held on the processing stage 20 shown in FIG. 4 is identical to the position of the center RC of the reference wafer RW held on the centering stage 10 shown in FIG. 8. In other words, a position of an end point of the eccentricity vector Pv' coincides with a position of an end point of the eccentricity vector Pv.

In FIG. 10, the initial relative position of the central axis C1 of the centering stage 10 with respect to the central axis C2 of the processing stage 20 is indicated by a vector dv. This vector dv can be determined as follows:

$$dv = Pv' - Pv \quad (1)$$

When each of the eccentricity vector Pv' and the eccentricity vector Pv is resolved into an i-direction vector on the angle reference line RL and a j-direction vector which is perpendicular to the angle reference line RL, the eccentricity vector Pv' and the eccentricity vector Pv can be expressed as $$Pv' = (|Pv'|\cos\alpha)iv + (|Pv'|\sin\alpha)jv \quad (2)$$

$$Pv = (|Pv|\cos\beta)iv + (|Pv|\sin\beta)jv \quad (3)$$

where |Pv'| represents the amount of eccentricity of the center RC of the reference wafer RW from the central axis C2 of the processing stage 20, |Pv| represents the amount of eccentricity of the center RC of the reference wafer RW from the central axis C1 of the centering stage 10, α represents the angle of the eccentricity vector Pv' with respect to the angle reference line RL, β represents the angle of the eccentricity vector Pv with respect to the angle reference line PL, iv represents an i-direction vector, and jv represents a j-direction vector.

As can be seen from FIG. 10, the angle α indicates the eccentricity direction of the center RC of the reference wafer RW from the central axis C2 of the processing stage 20, and the angle β indicates the eccentricity direction of the center RC of the reference wafer RW from the central axis C1 of the centering stage 10.

From the above equations (2) and (3), the vector dv, which indicates the initial relative position of the central axis C1 of the centering stage 10 with respect to the central axis C2 of the processing stage 20, can be determined as follows:

$$\begin{aligned} dv &= Pv' - Pv \\ &= (|Pv'|\cos\alpha - |Pv|\cos\beta)iv + (|Pv'|\sin\alpha - |Pv|\sin\beta)jv \\ &= aiv + bjv \end{aligned} \quad (4)$$

$$a = |Pv'|\cos\alpha - |Pv|\cos\beta \quad (5)$$

$$b = |Pv'|\sin\alpha - |Pv|\sin\beta \quad (6)$$

$$\theta = \tan^{-1}(b/a) \quad (7)$$

Figure 11:
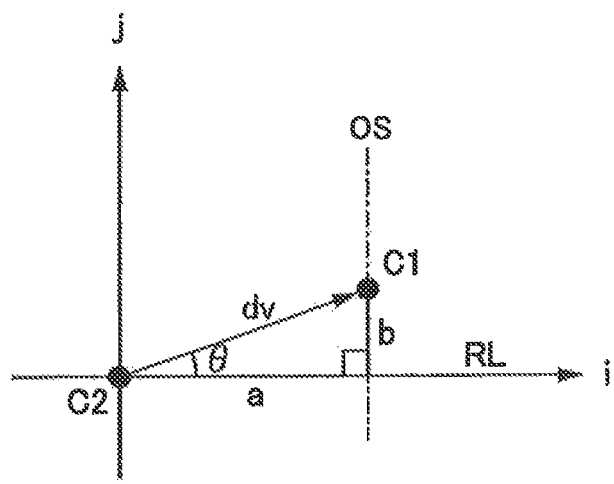
FIG. 11 is a diagram showing an initial relative position of the central axis of the centering stage with respect to the central axis of the processing stage.

As shown in FIG. 11, the initial relative position of the central axis C1 of the centering stage 10 with respect to the central axis C2 of the processing stage 20 can be expressed by using factors a, b, θ that specify the vector dv. The initial relative position (i.e., the vector dv) of the central axis C1 of the centering stage 10 with respect to the central axis C2 of the processing stage 20 can thus be obtained. Numerical values of the factors a, b, θ that specify the initial relative position are inherent to the polishing apparatus. The numerical values of the factors a, b, θ that specify the initial relative position are stored in the operation controller 75.

After the initial relative position of the central axis C1 of the centering stage 10 with respect to the central axis C2 of the processing stage 20 is determined as in the above-described manner, a wafer, to be polished, is transported to the polishing apparatus, where the wafer is polished. The initial relative position of the central axis C1 of the centering stage 10 with respect to the central axis C2 of the processing stage 20 is a positional deviation due to the structure of the polishing apparatus. This positional deviation does not change basically. However, the positional deviation can change as a large number of wafers are polished. In order to correct such positional deviation, mechanical adjustment (i.e. positional adjustment manually conducted by a worker) was conventionally needed. According to this embodiment, an influence of a change in the initial relative position can be eliminated by performing the above-described process of recalculating the initial relative position, and by updating the factors a, b, θ which have been stored in the operation controller 75 and represent the initial relative position. This embodiment thus does not require the manual positional adjustment by a worker, and can therefore reduce downtime of the polishing apparatus.

In contrast, a relative position of a wafer with respect to the processing stage 20 varies every time the polishing apparatus receives a wafer to be polished. Therefore, centering of a wafer is performed before polishing of the wafer in the following manner.

Figure 12:
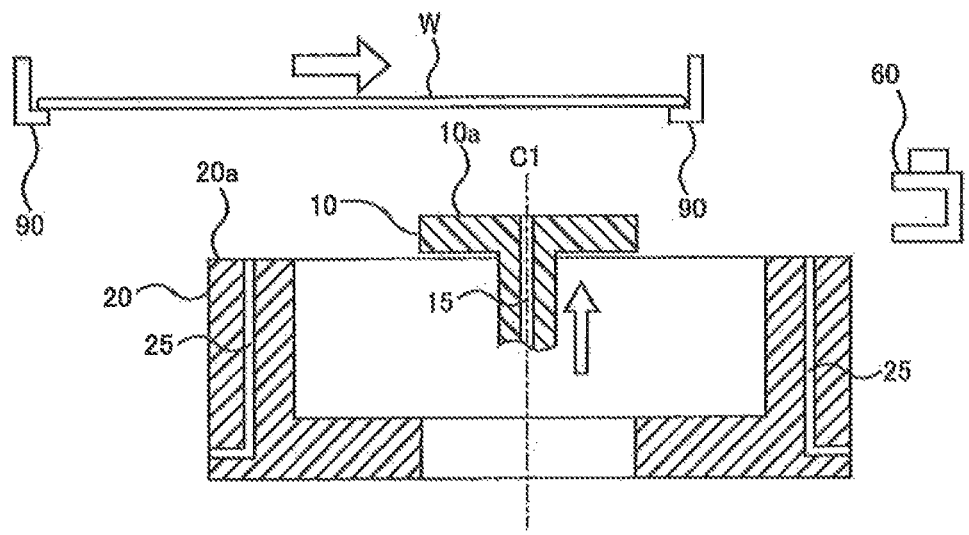
FIG. 12 is a diagram illustrating an operation of transporting a wafer, to be polished, by hands of a transport mechanism.
Figure 13:
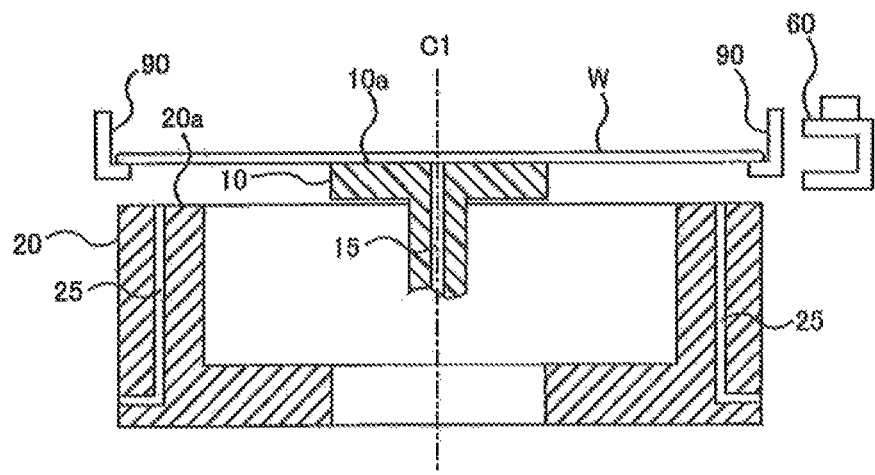
FIG. 13 is a diagram illustrating an operation of holding the wafer with the centering stage.
Figure 14:
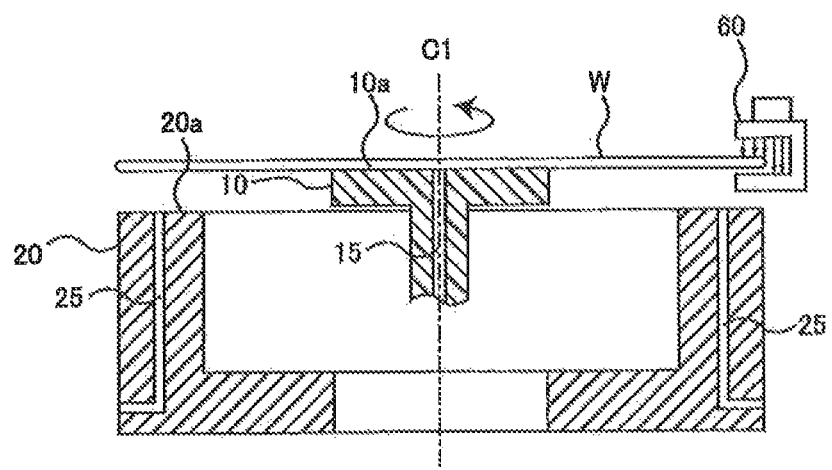
FIG. 14 is a diagram showing an operation of measuring the amount of eccentricity and the eccentricity direction of the center of the wafer from the central axis of the centering stage.

As shown in FIG. 12, the centering stage 10 is elevated to an elevated position by the stage elevating mechanism 51 (see FIG. 1). The first substrate holding surface 10a of the centering stage 10 at this elevated position lies at a higher position than the second substrate holding surface 20a of the processing stage 20. In this state, a wafer W is transported by hands 90 of a transport mechanism and placed on the circular first substrate holding surface 10a of the centering stage 10 as shown in FIG. 13. A vacuum is created in the first vacuum line 15, whereby the center-side area of the lower surface of the wafer W is held on the first substrate holding surface 10a by vacuum suction. Thereafter, as shown in FIG. 14, the hands 90 of the transport mechanism leave the polishing apparatus, and the centering stage 10 is rotated about its axis C1. The eccentricity detector 60 approaches the rotating wafer W and then determines the amount of eccentricity and the eccentricity direction of the center of the wafer W from the central axis C1 of the centering stage 10, in the same manner as described above with reference to the reference wafer RW.

Figure 15:
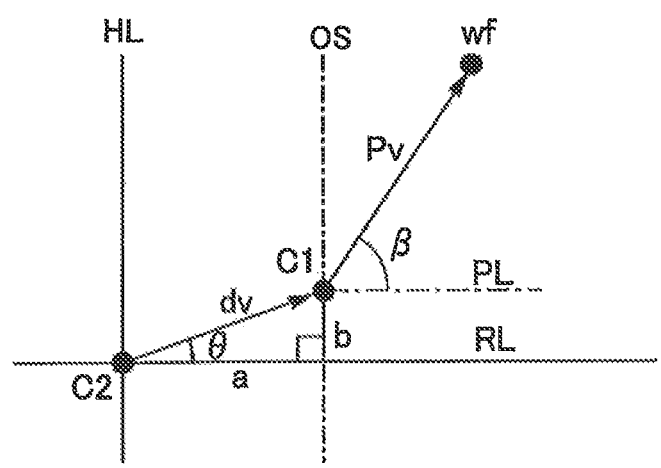
FIG. 15 is a diagram showing a positional relationship between the central axis of the processing stage, the central axis of the centering stage and the center of the wafer.

FIG. 15 is a diagram showing a positional relationship between the central axis C2 of the processing stage 20, the central axis C1 of the centering stage 10 and a center wf of the wafer W. The amount of eccentricity of the center wf of the wafer W from the central axis C1 of the centering stage 10 is represented by a distance from the central axis C1 of the centering stage 10 to the center wf of the wafer W, i.e. the magnitude |Pv| of the eccentricity vector Pv. The eccentricity direction of the center wf of the wafer W from the central axis C1 of the centering stage 10 is represented by the angle β of the eccentricity vector Pv with respect to the angle reference line PL. The determined amount of eccentricity (|Pv|) and the determined eccentricity direction (angle β) of the wafer W are sent to the operation controller 75.

Based on the initial relative position of the central axis C1 of the centering stage 10 with respect to the central axis C2 of the processing stage 20, and based on the amount of eccentricity |Pv| and the eccentricity direction (angle β) of the wafer W, the operation controller 75 calculates a distance by which the centering stage 10 is to be moved along the offset axis OS and an angle through which the centering stage 10 is to be rotated, which are necessary for the center wf of the wafer W to be located on the central axis C2 of the processing stage 20. The moving mechanism 41 and the centering-stage rotating mechanism 36 move and rotate the centering stage 10 until the center wf of the wafer W on the centering stage 10 is located on the central axis C2 of the processing stage 20.

Figure 16:
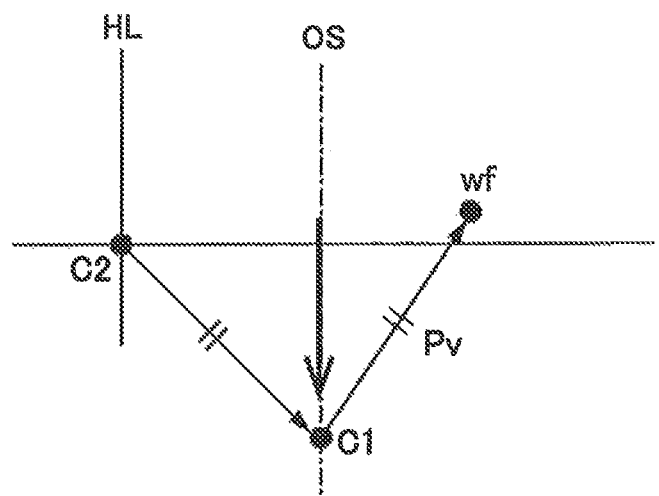
FIG. 16 is a diagram illustrating an operation of moving the centering stage along an offset axis by a distance calculated by an operation controller.
Figure 17:
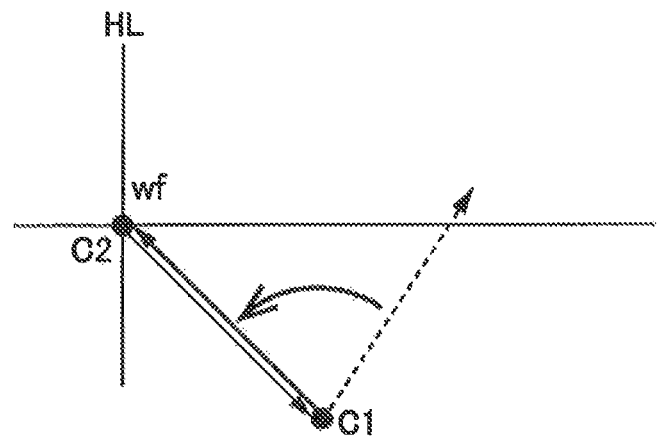
FIG. 17 is a diagram illustrating an operation of rotating the centering stage together with the wafer through an angle calculated by the operation controller.

FIG. 16 is a diagram illustrating an operation of the moving mechanism 41 when moving the centering stage 10 along the offset axis OS by the distance calculated by the operation controller 75. As shown in FIG. 16, the moving mechanism 41 moves the centering stage 10 horizontally along the offset axis OS until the distance between the central axis C1 of the centering stage 10 and the central axis C2 of the processing stage 20 becomes equal to the amount of eccentricity |Pv|. Further, as shown in FIG. 17, the centering-stage rotating mechanism 36 rotates the centering stage 10, together with the wafer W, through the angle calculated by the operation controller 75. More specifically, the centering-stage rotating mechanism 36 rotates the centering stage 10 until the center wf of the wafer W on the centering stage 10 lies on a straight line HL which extends through the central axis C2 of the processing stage 20 and extends parallel to the offset axis OS.

In this manner, the center wf of the wafer W on the centering stage 10 can be located on the central axis C2 of the processing stage 20 by the horizontal movement of the centering stage 10 along the offset axis OS and the rotation of the centering stage 10. In this embodiment, the centering-stage rotating mechanism 36, the moving mechanism 41 and the operation controller 75 constitute an aligner for performing the centering operation of moving and rotating the centering stage 10 until the center wf of the wafer W on the centering stage 10 is located on the central axis C2 of the processing stage 20. In one embodiment, the rotation of the centering stage 10 may be performed first, followed by the movement of the centering stage 10 along the offset axis OS. In order to complete the centering operation in a shorter time, the moving mechanism 41 and the centering-stage rotating mechanism 36 may simultaneously perform the horizontal movement of the centering stage 10 along the offset axis OS and the rotation of the centering stage 10.

Figure 18:
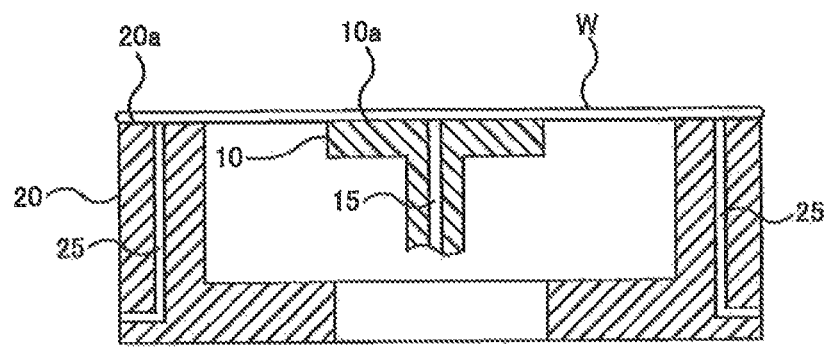
FIG. 18 is a diagram illustrating an operation of transferring the wafer from the centering stage to the processing stage.
Figure 19:
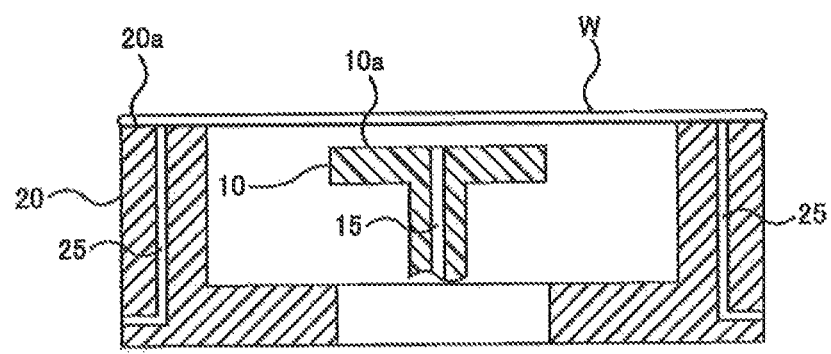
FIG. 19 is a diagram illustrating an operation of detaching the wafer from the centering stage.

After completion of the above-described centering operation, as shown in FIG. 18, the centering stage 10 is lowered until the peripheral area of the lower surface of the wafer W is brought into contact with the second substrate holding surface 20a of the processing stage 20. In this state, a vacuum is created in each of the second vacuum lines 25, whereby the peripheral area of the lower surface of the wafer W is held on the processing stage 20 by vacuum suction. Thereafter, the first vacuum line 15 is ventilated, so that the wafer W can be separated from the centering stage 10. As shown in FIG. 19, the centering stage 10 is further lowered to a predetermined lowered position at which the first substrate holding surface 10a is separated away from the wafer W. Consequently, the wafer W is held only by the processing stage 20.

The centering stage 10 is configured to hold only the center-side area of the lower surface of the wafer W, while the processing stage 20 is configured to hold only the peripheral area of the lower surface of the wafer W. If the wafer is simultaneously held by both the centering stage 10 and the processing stage 20, then the wafer W may warp. This is because it is very difficult in the light of mechanical positioning accuracy to make the first substrate holding surface 10a of the centering stage 10 and the second substrate holding surface 20a of the processing stage 20 lie in the same horizontal plane.

According to this embodiment, during polishing of the wafer W, only the peripheral area of the lower surface of the wafer W is held by the processing stage 20, and the centering stage 10 is away from the wafer W. Warping of the wafer W can therefore be prevented.

Figure 20:
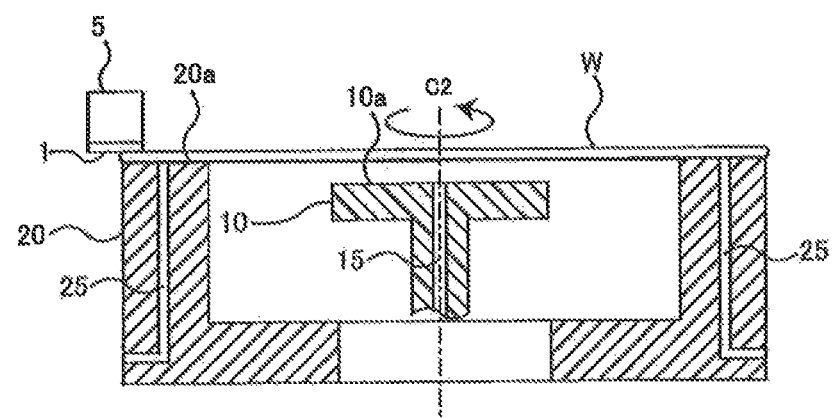
FIG. 20 is a diagram illustrating an operation of polishing the wafer, while rotating the wafer by means of the processing stage.

As shown in FIG. 20, the processing stage 20 is rotated about its central axis C2. Since the center of the wafer W is on the central axis C2 of the processing stage 20, the wafer W is rotated about the center of the wafer W. While the wafer W is rotating, a polishing liquid (e.g. pure water or slurry) is supplied onto the wafer W from a not-shown polishing-liquid supply nozzle. Further, the polishing head 5 presses down the polishing tool 1, with its lower surface (polishing surface) being parallel to the upper surface of the wafer W, against a peripheral portion of the rotating wafer W, thereby polishing the peripheral portion of the wafer W. Since the peripheral area of the lower surface of the wafer W is held on the processing stage 20 during polishing of the wafer W, the processing stage 20 can support the load of the polishing tool 1 from below the polishing tool 1. This can prevent warping of the wafer W during polishing.

The polished wafer W is taken out of the polishing apparatus according to a reverse operation sequence excepting the centering operation. The annular second substrate holding surface 20a has a further advantage that, as compared to a substrate stage which holds by suction an entire lower surface of a wafer, the polished wafer W is less likely to break when it is detached from the second substrate holding surface 20a.

The centering operation described above with reference to FIGS. 16 and 17 is performed by the horizontal movement and rotation of the centering stage 10. The direction of the horizontal movement of the centering stage 10 may preferably be a direction which can minimize a time to complete the centering operation. In other words, the horizontal movement of the centering stage 10 is desirably performed in a direction which can minimize a movement distance required for the center of the wafer W to coincide with the central axis C2 of the processing stage 20. Such a direction of the horizontal movement of the centering stage 10, which can minimize the time to complete the centering operation, is determined according to the following eight cases of positional relationships between the central axis C1 of the centering stage 10, the central axis C2 of the processing stage 20, and a center wf of a wafer W on the centering stage 10.

Figure 21:
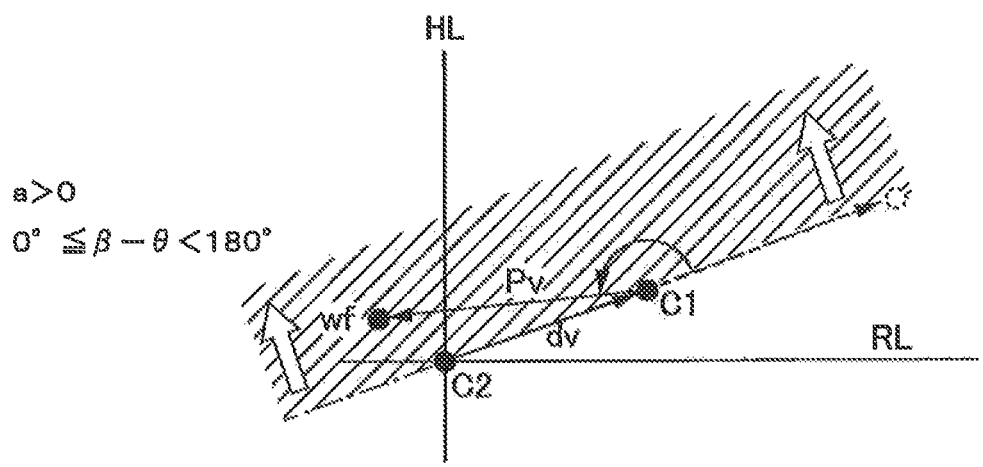
FIG. 21 is a diagram showing a case No. 1 of a positional relationship between the central axis of the centering stage, the central axis of the processing stage and the center of the wafer on the centering stage.

FIG. 21 is a diagram showing a case No. 1 of a positional relationship between the central axis C1 of the centering stage 10, the central axis C2 of the processing stage 20 and a center wf of a wafer on the centering stage 10. As shown in FIG. 21, the case No. 1 is a case where the length "a" of a component of the vector dv, parallel to the angle reference line RL, is more than 0 (a>0), and the difference between the angle β and the angle θ is not less than 0 degrees and less than 180 degrees (0°≤β−θ<180°). In FIG. 21 the "0°≤β−θ<180°" area is shown with hatching. In the case No. 1, the centering stage 10 moves in a direction closer to the angle reference line RL.

Figure 22:
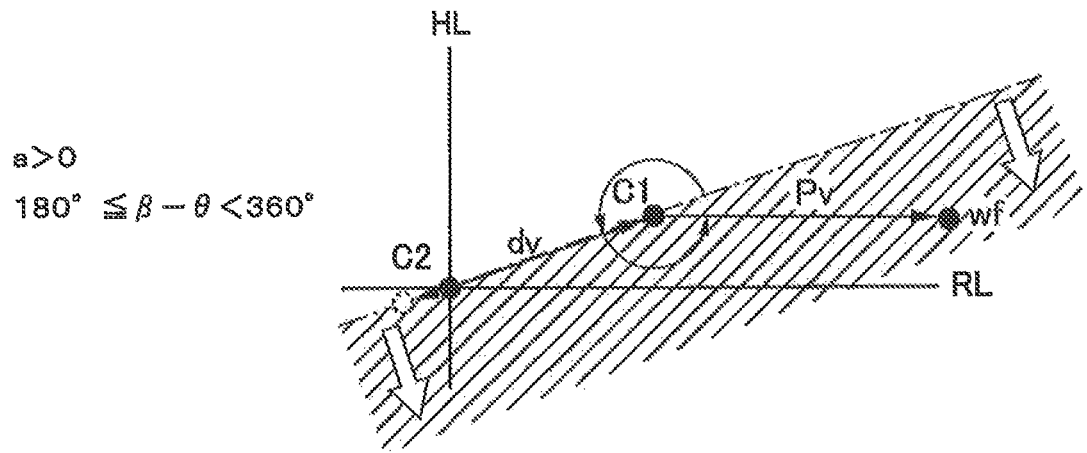
FIG. 22 is a diagram showing a case No. 2 of a positional relationship between the central axis of the centering stage, the central axis of the processing stage and the center of the wafer on the centering stage.

FIG. 22 is a diagram showing a case No. 2 of a positional relationship between the central axis C1 of the centering stage 10, the central axis C2 of the processing stage 20 and a center wf of a wafer on the centering stage 10. As shown in FIG. 22, the case No. 2 is a case where the length "a" of a component of the vector dv, parallel to the angle reference line RL, is more than 0 (a>0), and the difference between the angle β and the angle θ is not less than 180 degrees and less than 360 degrees (180°≤β−θ<360°). In FIG. 22 the "180°≤β−θ<360°" area is shown with hatching. In the case No. 2, the centering stage 10 moves in a direction away from the angle reference line RL.

Figure 23:
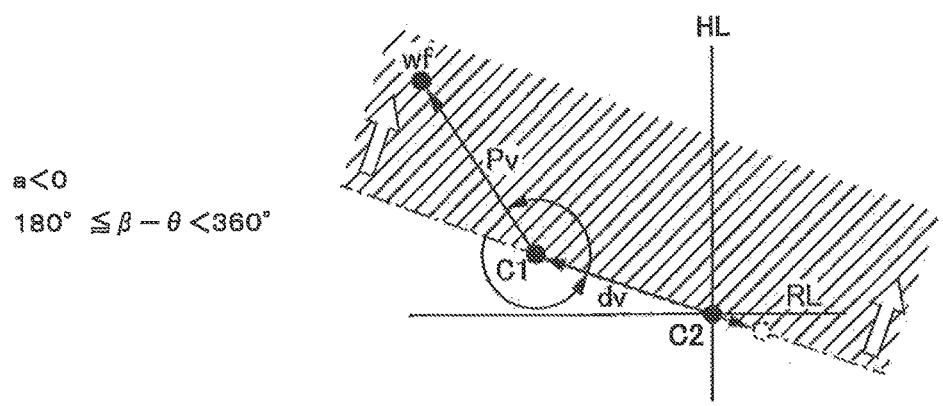
FIG. 23 is a diagram showing a case No. 3 of a positional relationship between the central axis of the centering stage, the central axis of the processing stage and the center of the wafer on the centering stage.

FIG. 23 is a diagram showing a case No. 3 of a positional relationship between the central axis C1 of the centering stage 10, the central axis C2 of the processing stage 20 and a center wf of a wafer on the centering stage 10. As shown in FIG. 23, the case No. 3 is a case where the length "a" of a component of the vector dv, parallel to the angle reference line RL, is less than 0 (a<0), and the difference between the angle β and the angle θ is not less than 180 degrees and less than 360 degrees (180°≤β−θ<360°). In FIG. 23 the "180°≤β−θ<360°" area is shown with hatching. In the case No. 3, the centering stage 10 moves in a direction closer to the angle reference line RL.

Figure 24:
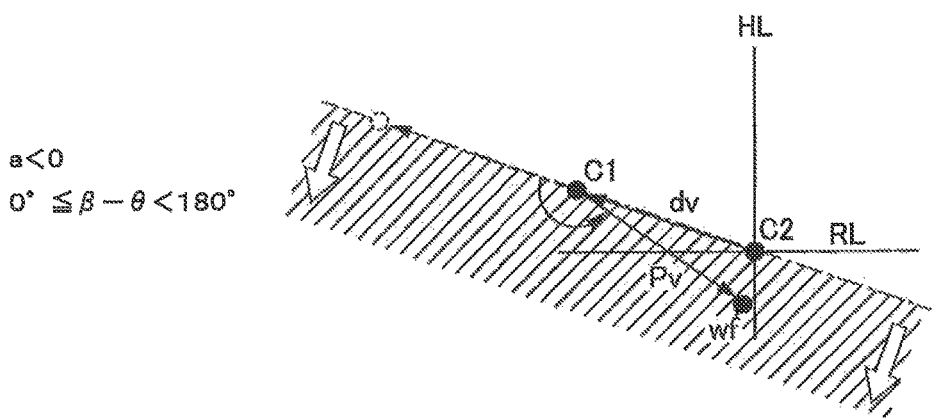
FIG. 24 is a diagram showing a case No. 4 of a positional relationship between the central axis of the centering stage, the central axis of the processing stage and the center of the wafer on the centering stage.

FIG. 24 is a diagram showing a case No. 4 of a positional relationship between the central axis C1 of the centering stage 10, the central axis C2 of the processing stage 20 and a center wf of a wafer on the centering stage 10. As shown in FIG. 24, the case No. 4 is a case where the length "a" of a component of the vector dv, parallel to the angle reference line RL, is less than 0 (a<0), and the difference between the angle β and the angle θ is not less than 0 degrees and less than 180 degrees (0°≤β−θ<180°). In FIG. 24 the "0°≤β−θ<180°" area is shown with hatching. In the case No. 4, the centering stage 10 moves in a direction away from the angle reference line RL.

Figure 25:
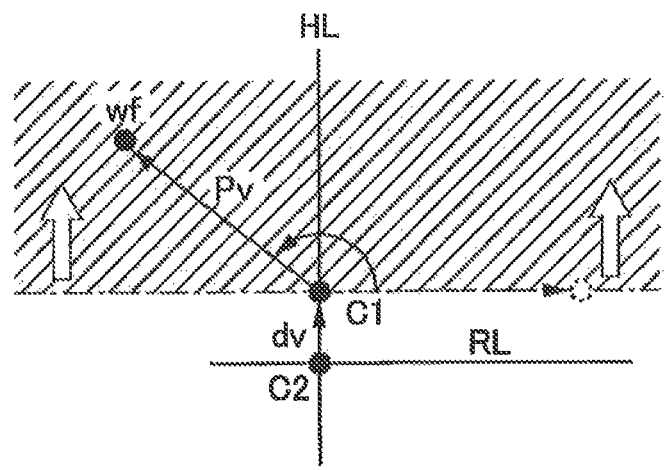
FIG. 25 is a diagram showing a case No. 5 of a positional relationship between the central axis of the centering stage, the central axis of the processing stage and the center of the wafer on the centering stage.

FIG. 25 is a diagram showing a case No. 5 of a positional relationship between the central axis C1 of the centering stage 10, the central axis C2 of the processing stage 20 and a center wf of a wafer on the centering stage 10. As shown in FIG. 25, the case No. 5 is a case where the length "a" of a component of the vector dv, parallel to the angle reference line RL, is 0 (a=0), the angle θ is 90 degrees (θ=90°), and the angle β is not less than 0 degrees and less than 180 degrees (0°≤β<180°). In FIG. 25 the "0°≤β<180°" area is shown with hatching. In the case No. 5, the centering stage 10 moves in a direction closer to the angle reference line RL.

Figure 26:
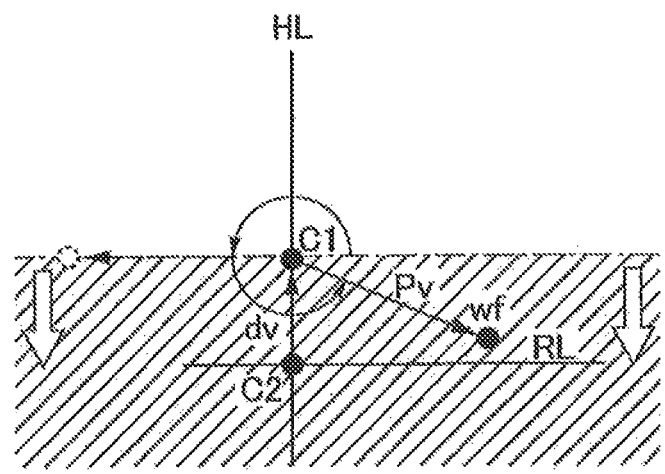
FIG. 26 is a diagram showing a case No. 6 of a positional relationship between the central axis of the centering stage, the central axis of the processing stage and the center of the wafer on the centering stage.

FIG. 26 is a diagram showing a case No. 6 of a positional relationship between the central axis C1 of the centering stage 10, the central axis C2 of the processing stage 20 and a center wf of a wafer on the centering stage 10. As shown in FIG. 26, the case No. 6 is a case where the length "a" of a component of the vector dv, parallel to the angle reference line RL, is 0 (a=0), the angle θ is 90 degrees (θ=90°), and the angle β is not less than 180 degrees and less than 360 degrees (180°≤β<360°). In FIG. 26 the "180°≤β<360°" area is shown with hatching. In the case No. 6, the centering stage 10 moves in a direction away from the angle reference line RL.

Figure 27:
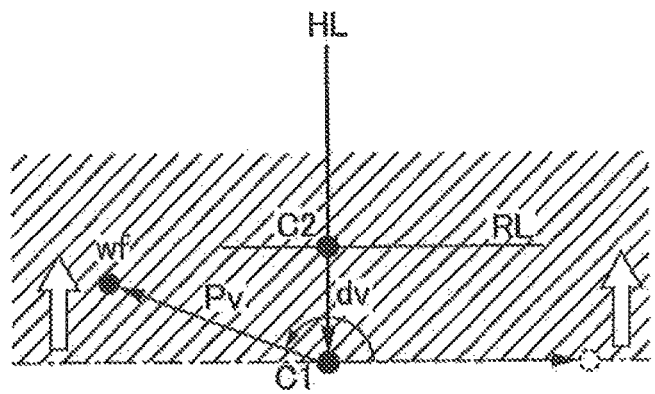
FIG. 27 is a diagram showing a case No. 7 of a positional relationship between the central axis of the centering stage, the central axis of the processing stage and the center of the wafer on the centering stage.

FIG. 27 is a diagram showing a case No. 7 of a positional relationship between the central axis C1 of the centering stage 10, the central axis C2 of the processing stage 20 and a center wf of a wafer on the centering stage 10. As shown in FIG. 27, the case No. 7 is a case where the length "a" of a component of the vector dv, parallel to the angle reference line RL, is 0 (a=0), the angle θ is −90 degrees (θ=−90°), and the angle β is not less than 0 degrees and less than 180 degrees (0°≤β<180°). In FIG. 27 the "0°≤β<180°" area is shown with hatching. In the case No. 7, the centering stage 10 moves in a direction away from the angle reference line RL.

Figure 28:
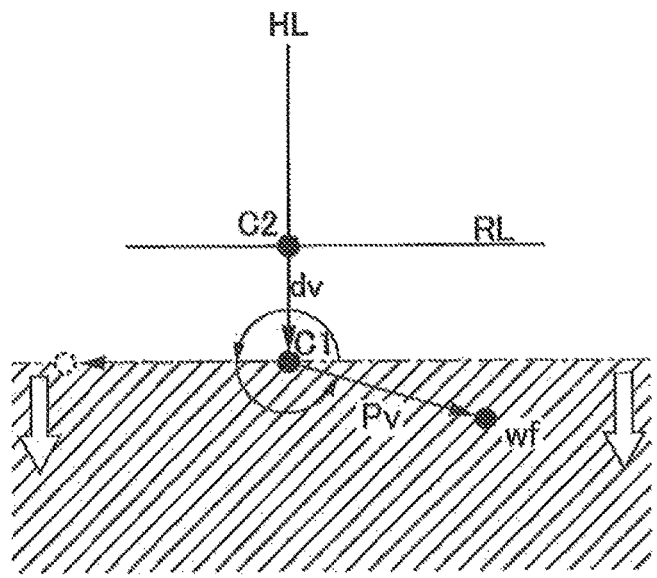
FIG. 28 is a diagram showing a case No. 8 of a positional relationship between the central axis of the centering stage, the central axis of the processing stage and the center of the wafer on the centering stage.

FIG. 28 is a diagram showing a case No. 8 of a positional relationship between the central axis C1 of the centering stage 10, the central axis C2 of the processing stage 20 and a center wf of a wafer on the centering stage 10. As shown in FIG. 28, the case No. 8 is a case where the length "a" of a component of the vector dv, parallel to the angle reference line RL, is 0 (a=0), the angle θ is −90 degrees (θ=−90°), and the angle β is not less than 180 degrees and less than 360 degrees (180°≤β<360°). In FIG. 28 the "180°≤β<360°" area is shown with hatching. In the case No. 8, the centering stage 10 moves in a direction closer to the angle reference line RL.

In the above-described cases, if a calculated numeral value of "β−θ" is not within a range of 0° to 360°, a multiple of 360° is added to the value of "β−θ". For example, if the value of "β−θ" is −45°, 360°×1 is added to that value to make a new "β−θ" value of 315°. If the value of "β−θ" is 726°, −360°×2 is added to that value to make a new "β−θ" value of 6°.

The above-discussed eight cases each indicate a positional relationship between the central axis C1 of the centering stage 10, the central axis C2 of the processing stage 20 and a center wf of a wafer on the centering stage 10. The directions of the horizontal movement of the centering stage 10, which can minimize a time to complete the centering operation, are determined in advance for the eight cases, respectively. These directions of the horizontal movement are stored in advance, in relation to the corresponding cases, in the operation controller 75. Also in the above eight cases, the movement of the centering stage 10 along the offset axis OS may be performed first, followed by the rotation of the centering stage 10, or the rotation of the centering stage 10 may be performed first, followed by the movement of the centering stage 10 along the offset axis OS. The movement of the centering stage 10 along the offset axis OS and the rotation of the centering stage 10 may be performed simultaneously.

Figure 29:
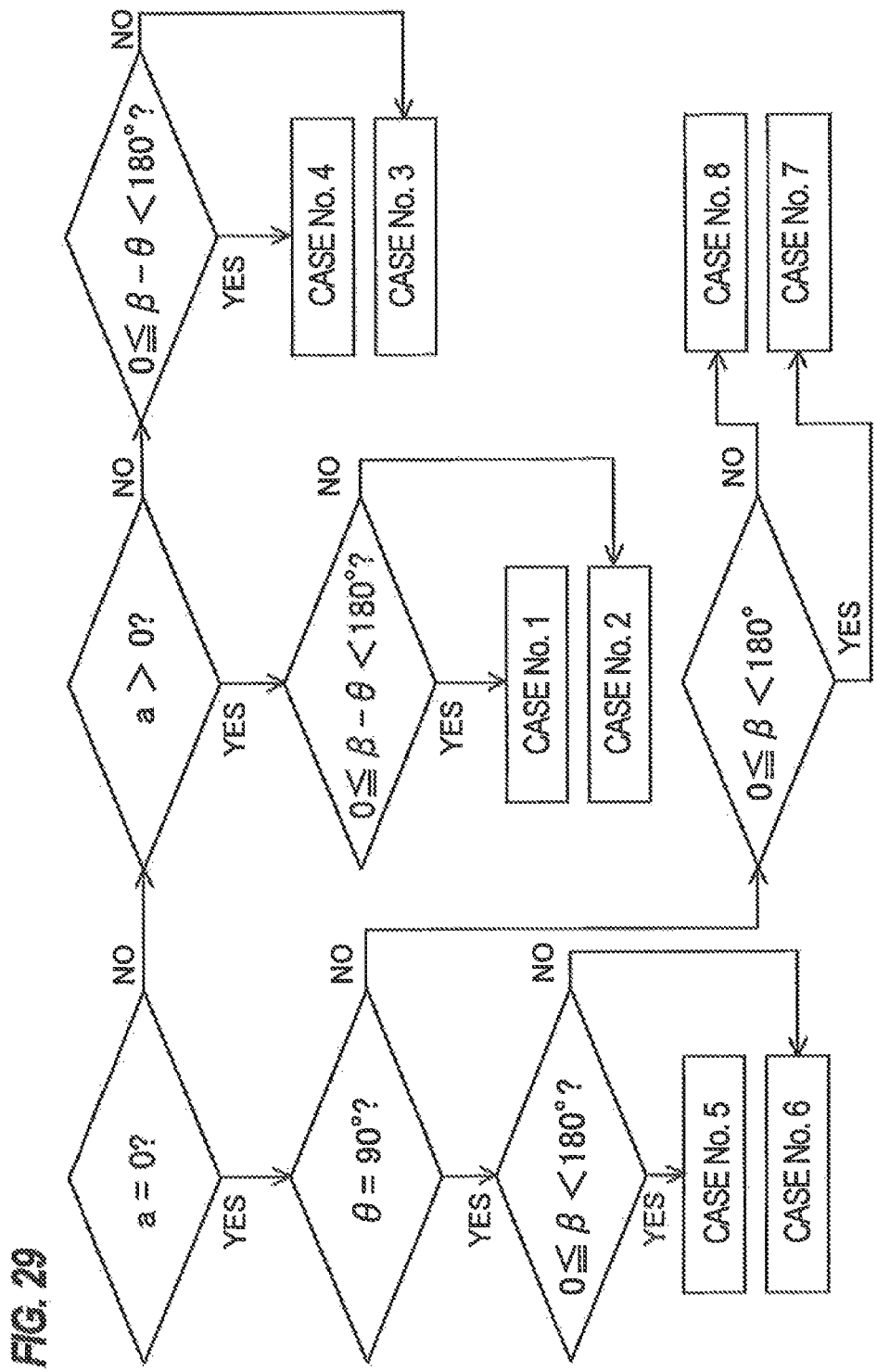
FIG. 29 is a flow chart of a process for determining whether a current positional relationship between the central axis of the centering stage, a center of a wafer and the central axis of the processing stage corresponds to any of the above eight cases.

FIG. 29 is a flow chart of a process for determining whether a current positional relationship between the central axis C1 of the centering stage 10, a center wf of a wafer W and the central axis C2 of the processing stage 20 corresponds to any of the above eight cases. Using the flow chart shown in FIG. 29, the operation controller 75 determines whether a current positional relationship between the central axis C1 of the centering stage 10, a center wf of a wafer W and the central axis C2 of the processing stage 20 corresponds to any of the above eight cases, and causes the centering stage 10 to move along the offset axis OS in a direction predetermined for each of the cases. By thus determining the direction of movement of the centering stage 10 according to the case classification, the centering operation can be completed in a shortest amount of time.

Figure 30:
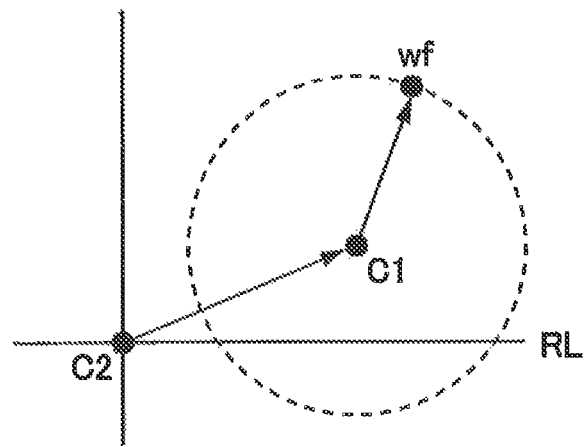
FIG. 30 is a diagram showing a case where a distance between the central axis of the processing stage and the central axis of the centering stage is longer than a distance between the central axis of the centering stage and a center of a wafer.

According to the above-described centering operation, a center of a wafer W can be located on the central axis C2 of the processing stage 20 even if the central axis C1 of the centering stage 10 is at a distance from the central axis C2 of the processing stage 20. However, as shown in FIG. 30, if the distance between the central axis C2 of the processing stage 20 and the central axis C1 of the centering stage 10 is longer than a distance between the central axis C1 of the centering stage 10 and a center wf of a wafer W, the center wf of the wafer W cannot be located on the central axis C2 of the processing stage 20.

Figure 31:
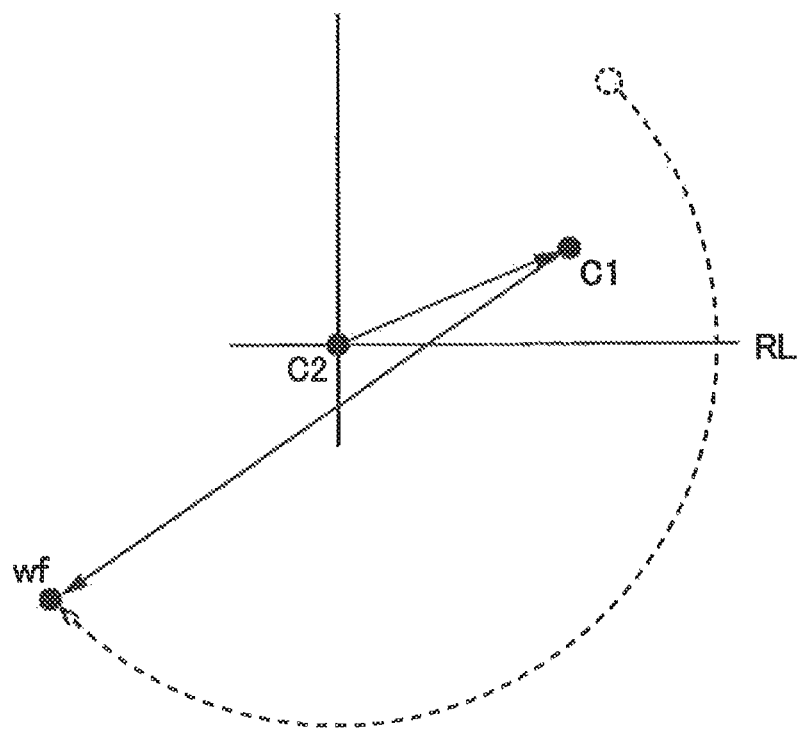
FIG. 31 is a diagram showing a positional relationship between the central axis of the processing stage, the central axis of the centering stage and the center of the wafer after the processing stage is rotated together with the wafer through 180 degrees.
Figure 32:
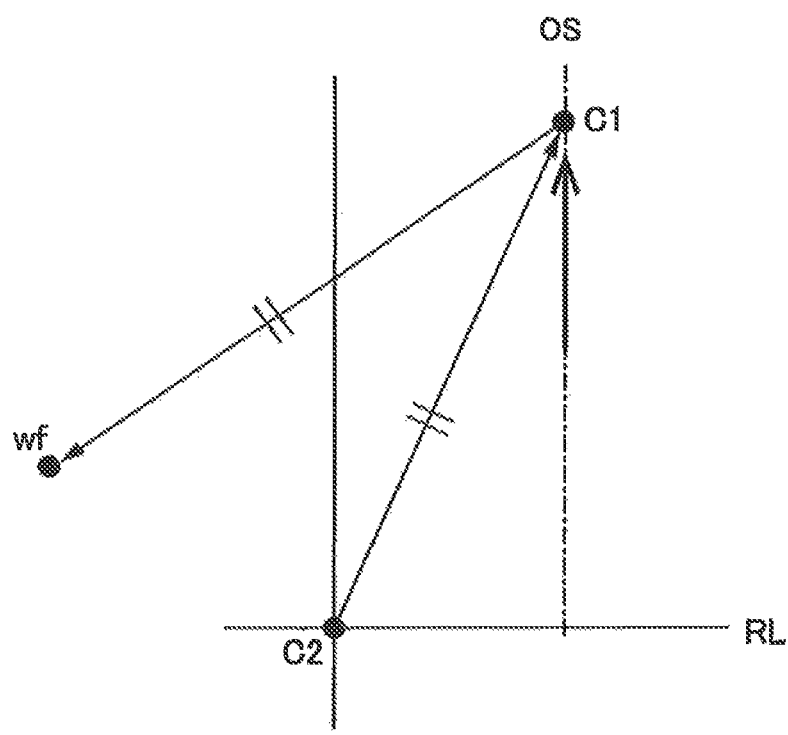
FIG. 32 is a diagram illustrating an operation of moving the centering stage along the offset axis.
Figure 33:
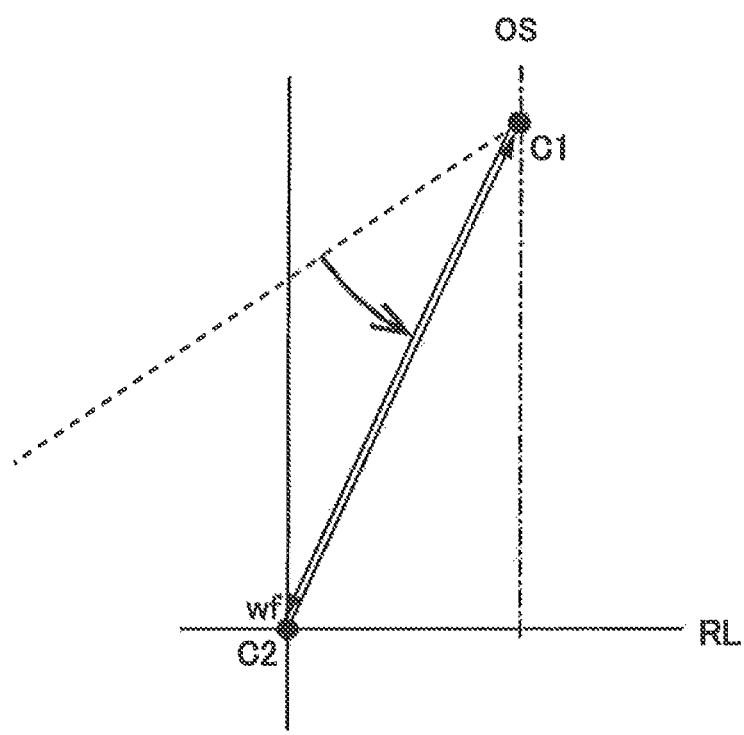
FIG. 33 is a diagram illustrating an operation of rotating the centering stage.

In such a case, the wafer W is once transferred from the centering stage 10 to the processing stage 20, and the processing stage 20 is then rotated 180 degrees. More specifically, as discussed previously with reference to FIGS. 18 and 19, the centering stage 10 is lowered to once transfer the wafer W to the processing stage 20, and then the processing stage 20 holding the wafer W is rotated 180 degrees. Thereafter, the centering stage 10 is elevated again so that the wafer W is transferred from the processing stage 20 to the centering stage 10. As a result, as shown in FIG. 31, the distance between the central axis C2 of the processing stage 20 and the central axis C1 of the centering stage 10 becomes shorter than the distance between the central axis C1 of the centering stage 10 and the center wf of the wafer W. Accordingly, as shown in FIGS. 32 and 33, the center of the wafer W can be located on the central axis C2 of the processing stage 20 by the combination of the movement of the centering stage 10 along the offset axis OS and the rotation of the centering stage 10. Also in this case, the rotation of the centering stage 10 may be performed first, followed by the movement of the centering stage 10 along the offset axis OS. The movement of the centering stage 10 along the offset axis OS and the rotation of the centering stage 10 may be performed simultaneously.

A width of a portion, to be polished by the polishing tool 1 shown in FIG. 1, of a wafer W (hereinafter referred to as a polishing width) is determined by the relative position of the polishing tool 1 with respect to the wafer W. According to the above-described embodiments, since the center of the wafer W can be located on the central axis C2 of the processing stage 20, the polishing width can be made constant over the entire circumference of the wafer W.

As described above, even if the distance between the central axis C2 of the processing stage 20 and the central axis C1 of the centering stage 10 is longer than a distance between the central axis C1 of the centering stage 10 and a center wf of a wafer W, the center of the wafer W can be located on the central axis C2 of the processing stage 20 by rotating the processing stage 180 degrees together with the wafer W. However, depending on a required specification of a product wafer, it may not be necessary for a center of a wafer W to completely coincide with the central axis C2 of the processing stage 20. In such a case, the centering stage 10 may be moved and rotated in such a manner as to minimize the distance between the center of the wafer W on the centering stage 10 and the central axis C2 of the processing stage 20.

Figure 34:
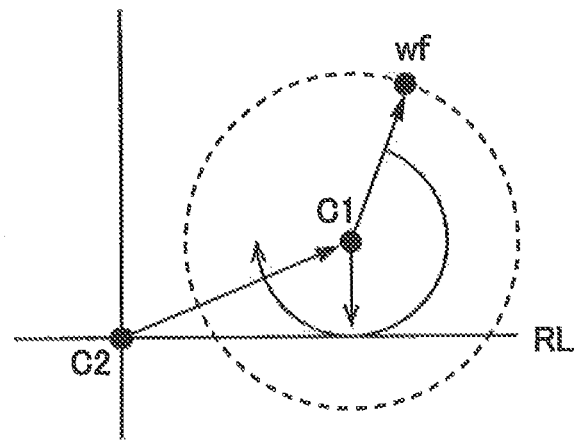
FIG. 34 is a diagram illustrating operations of moving and rotating the centering stage in such a manner as to minimize a distance between a center of a wafer on the centering stage and the central axis of the processing stage.
Figure 34:
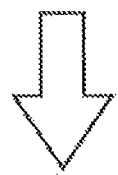
Figure 34:
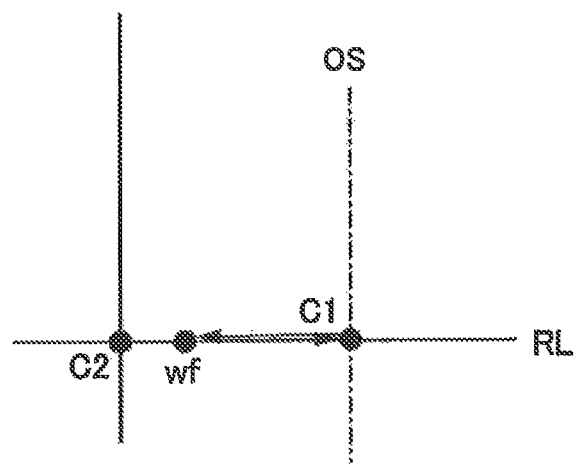

FIG. 34 is a diagram illustrating an operation of moving and rotating the centering stage 10 in such a manner as to minimize a distance between a center wf of a wafer W on the centering stage 10 and the central axis C2 of the processing stage 20. As shown in FIG. 34, the centering stage 10 is moved along the offset axis until the center wf of the wafer W lies on the angle reference line RL and, in addition, the centering stage 10 is rotated until a distance between the center wf of the wafer W and the central axis C2 of the processing stage 20 reaches a minimum. Such operations can minimize the distance between the center wf of the wafer W on the centering stage 10 and the central axis C2 of the processing stage 20.

Figure 35:
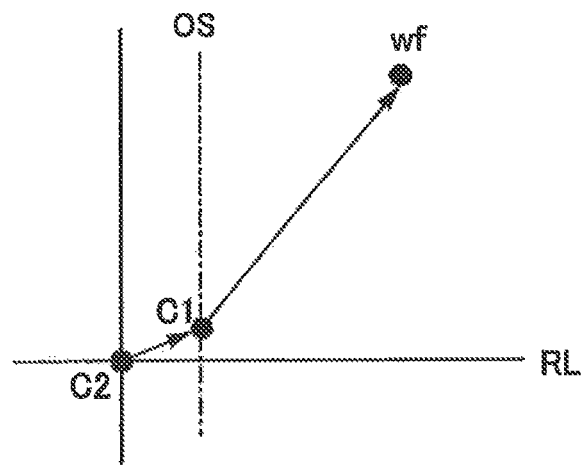
FIG. 35 is a diagram showing a case where a distance between the central axis of the centering stage and a center of a wafer is extremely longer than the distance between the central axis of the processing stage and the central axis of the centering stage.
Figure 36:
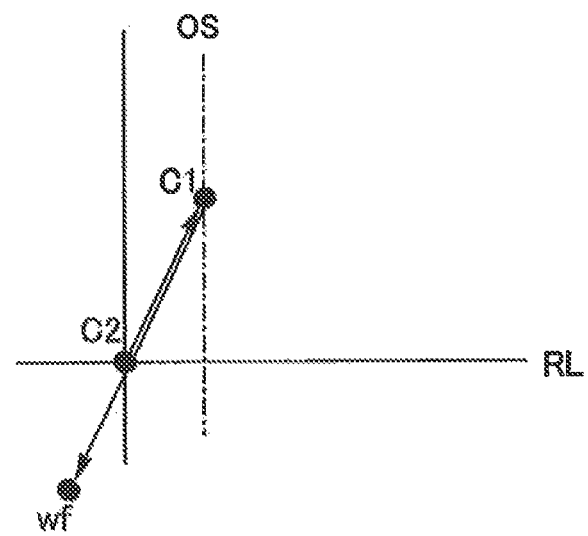
FIG. 36 is a diagram illustrating operations of moving and rotating the centering stage in such a manner as to minimize the distance between the center of the wafer on the centering stage and the central axis of the processing stage.

The movement of the centering stage 10 along the offset axis OS is performed by the moving mechanism 41. However, the moving mechanism 41 necessarily has a mechanical limit on a distance that the moving mechanism 41 can move the centering stage 10. If a movement distance of the centering stage 10, which is necessary for the centering operation, is longer than a maximum distance that the moving mechanism 41 can move the centering stage 10 along the offset axis OS, the wafer centering operation cannot be performed. For example, if a distance between the central axis C1 of the centering stage 10 and a center wf of a wafer W is extremely longer than the distance between the central axis C2 of the processing stage 20 and the central axis C1 of the centering stage 10 as shown in FIG. 35, a movement distance of the centering stage 10, which is necessary for the centering operation for the wafer W, may be longer than the maximum distance that the moving mechanism 41 can move the centering stage 10 along the offset axis OS. In such a case, as shown in FIG. 36, the centering stage 10 is preferably moved and rotated in such a manner as to minimize the distance between the center wf of the wafer W on the centering stage 10 and the central axis C2 of the processing stage 20.

As described hereinabove, the centering operation is performed by the moving mechanism 41 and the centering-stage rotating mechanism 36. Specifically, the moving mechanism 41 and the centering-stage rotating mechanism 36 move and rotate the centering stage 10 until a center wf of a wafer W on the centering stage 10 is located on the central axis C2 of the processing stage 20. In this centering operation, the moving mechanism 41 can move the centering stage 10 along the offset axis OS both in a forward direction and in a backward direction. Likewise, in the centering operation, the centering-stage rotating mechanism 36 can rotate the centering stage 10 both in a clockwise direction and in a counterclockwise direction.

However, backlash exists in the moving mechanism 41 and the centering-stage rotating mechanism 36. Therefore, if the moving mechanism 41 moves the centering stage 10 along the offset axis OS both in a forward direction and in a backward direction in the centering operation, the centering accuracy may decrease due to the backlash of the moving mechanism 41. Similarly, if the centering-stage rotating mechanism 36 rotates the centering stage 10 both in a clockwise direction and in a counterclockwise direction in the centering operation, the centering accuracy may decrease due to the backlash of the centering-stage rotating mechanism 36.

It is therefore preferred for the moving mechanism 41 to move the centering stage 10 along the offset axis OS only in one direction (i.e. only in a forward or backward direction)

in the centering operation. Likewise, it is preferred for the centering-stage rotating mechanism 36 to rotate the centering stage 10 only in one direction (i.e. only in a clockwise or counterclockwise direction) in the centering operation. For the same reason, the direction of rotation of the centering stage 10 and a wafer W in the operation for determining the amount of eccentricity and the eccentricity direction of the wafer W (hereinafter referred to as the eccentricity detection operation), performed by the eccentricity detector 60 prior to the centering operation, is preferably the same as the direction of rotation of the centering stage 10 and the wafer W in the centering operation.

Figure 37A:
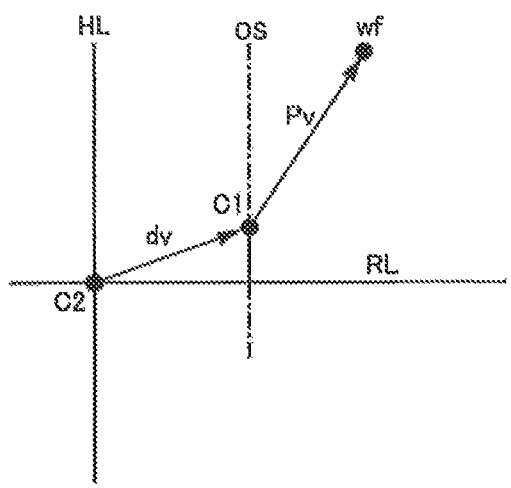
FIG. 37A is a diagram showing a positional relationship between the central axis of the processing stage, the central axis of the centering stage and a center of a wafer after performing an eccentricity detection operation and before performing a centering operation.

FIG. 37A is a diagram showing a positional relationship between the central axis C2 of the processing stage 20, the central axis C1 of the centering stage 10 and a center wf of a wafer W after performing the eccentricity detection operation and before performing the centering operation. The operation controller 75 first determines whether the distance between the central axis C1 of the centering stage 10 and the center wf of the wafer W, i.e. the amount of eccentricity |Pv| of the wafer W, is not more than the distance |dv| between the central axis C2 of the processing stage 20 and the central axis C1 of the centering stage 10. If the amount of eccentricity |Pv| of the wafer W on the centering stage 10 is less than the distance |dv|, the operation controller 75 performs the steps described above with reference to FIGS. 31 through 33.

Figure 37B:
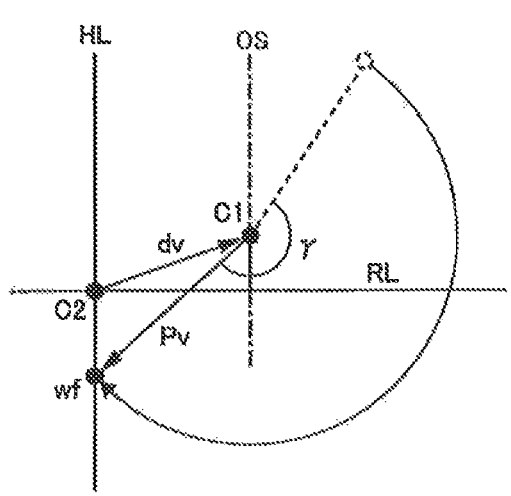
FIG. 37B is a diagram illustrating an operation of rotating the centering stage until the center of the wafer is located on a straight line HL.
Figure 37C:
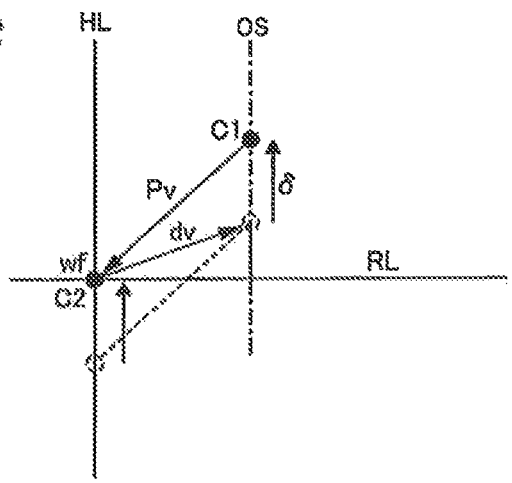
FIG. 37C is a diagram illustrating an operation of moving the centering stage until the center of the wafer is located on the central axis of the processing stage.

If the amount of eccentricity |Pv| of the wafer W is not less than the distance |dv|, the operation controller 75 calculates a distance δ by which the centering stage 10 is to be moved along the offset axis OS and an angle γ through which the centering stage 10 is to be rotated, which are necessary for the center wf of the wafer W to be located on the central axis C2 of the processing stage 20. The centering-stage rotating mechanism 36 and the moving mechanism 41 then perform the centering operation. Specifically, as shown in FIG. 37B, the centering-stage rotating mechanism 36 rotates the centering stage 10 through the angle γ in only one direction, thereby allowing the center wf of the wafer W to be on the straight line HL. Further, as shown in FIG. 37C, the moving mechanism 41 moves the centering stage 10 by the distance δ along the offset axis OS in only one direction, thereby allowing the center wf of the wafer W to be on the central axis C2 of the processing stage 20. The operation of rotating the centering stage 10, shown in FIG. 37B, may be performed after or simultaneously with the operation of moving the centering stage 10, shown in FIG. 37C. Such centering operation can eliminate the influence of the backlash that exists in the moving mechanism 41 and in the centering-stage rotating mechanism 36.

Some wafers may have diameters slightly larger than a predetermined reference diameter (e.g. 300.00 mm), and some wafers may have diameters slightly smaller than the reference diameter. If wafers have different diameters, the relative position of the polishing tool 1 with respect to each wafer differs from wafer to wafer, resulting in different polishing widths among the wafers. In order to prevent such variation in the polishing width, it is desirable to measure a diameter of a wafer before polishing that wafer.

Figure 38:
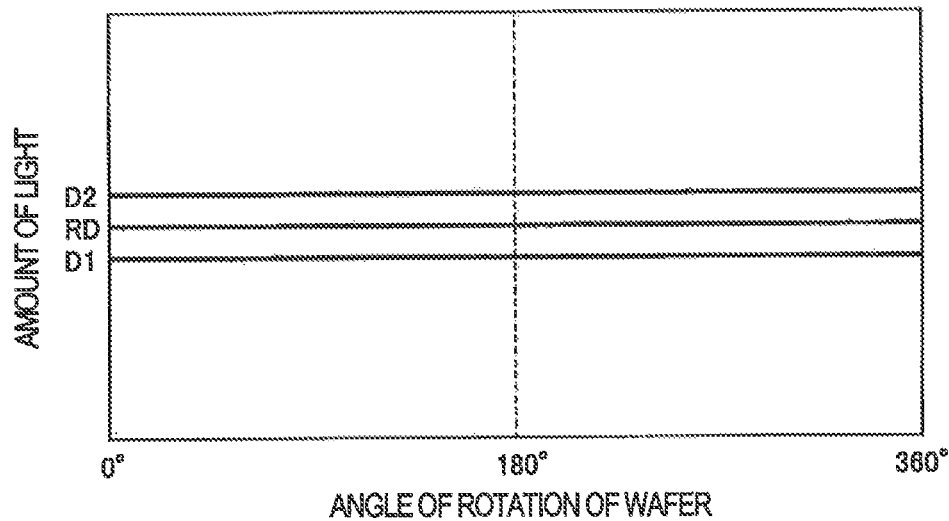
FIG. 38 is a graph showing an amount of light obtained during one revolution of a wafer.
Figure 38:
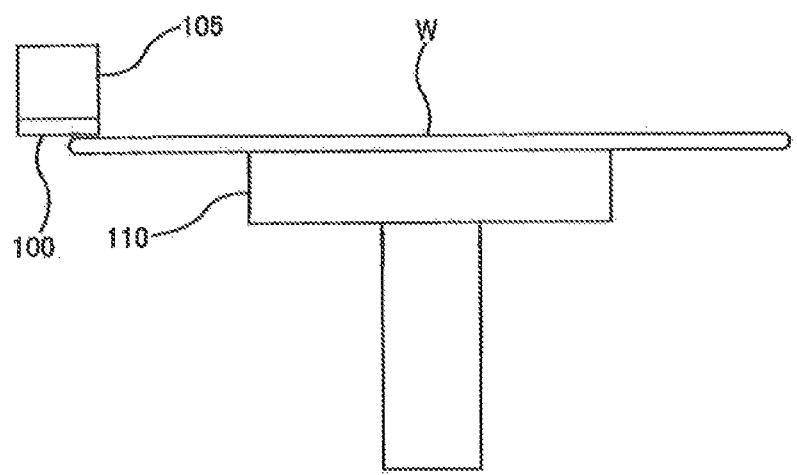

The eccentricity detector 60 shown in FIG. 1 is configured to be capable of measuring a diameter of a wafer. As shown in FIG. 38, an average D1 of the amount of light, obtained during one revolution of a wafer having a diameter (e.g. 300.10 mm) slightly larger than a predetermined reference diameter (e.g. 300.00 mm), is smaller than a reference light amount RD because of a slight decrease in the total amount of light. An average D2 of the amount of light, obtained during one revolution of a wafer having a diameter (e.g. 299.90 mm) slightly smaller than the reference diameter, is larger than the reference light amount RD because of a slight increase in the total amount of light.

A difference between the reference light amount RD and the average of the measured amount of light corresponds to a difference between the reference diameter and an actual diameter of the wafer W on the centering stage 10. Accordingly, the processing section 65 can determine the actual diameter of the wafer W on the centering stage 10 based on the difference between the reference light amount RD and the average of the measured amount of light.

As described above, since a diameter of a wafer W can be measured by the eccentricity detector 60, it is possible to precisely adjust the polishing width based on the measured value of the diameter. In other words, since a position of an outermost peripheral edge of the wafer W can be obtained precisely, the relative position of the polishing tool 1 with respect to the wafer W can be adjusted based on the position of the outermost peripheral edge of the wafer W. As a result, the polishing tool 1 can polish a peripheral portion of the wafer W with a desired polishing width.

While the polishing apparatus has been described as an embodiment of the substrate processing apparatus according to the present invention, the substrate processing apparatus and the substrate processing method of the present invention can also be applied to other apparatuses and methods for processing a substrate while holding the substrate, such as an apparatus and method for CVD, an apparatus and method for sputtering, etc.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing method comprising:
   holding a first area of a lower surface of a substrate with a centering stage;
   obtaining an amount of eccentricity and an eccentricity direction of a center of the substrate, when held on the centering stage, from a central axis of the centering stage;
   calculating a distance by which the centering stage is to be moved and an angle through which the centering stage is to be rotated, based on an initial relative position of the central axis of the centering stage with respect to a central axis of a processing stage, the amount of eccentricity, and the eccentricity direction, the distance and the angle to be calculated being a distance and an angle necessary for the center of the substrate on the centering stage to be located on the central axis of the processing stage;
   performing a centering operation of moving the centering stage by the calculated distance and rotating the centering stage through the calculated angle until the center of the substrate coincides with the central axis of the processing stage;
   holding a second area of the lower surface of the substrate with the processing stage, while separating the centering stage from the substrate; and
   processing the substrate while rotating the processing stage about its central axis.

2. The substrate processing method according to claim 1, wherein the centering operation includes:
- an operation of moving the centering stage along a predetermined offset axis until a distance between the central axis of the centering stage and the central axis of the processing stage becomes equal to the amount of eccentricity; and
- an operation of rotating the centering stage until the center of the substrate on the centering stage is located on a straight line which extends through the central axis of the processing stage and extends parallel to the predetermined offset axis.

3. The substrate processing method according to claim 2, wherein the operation of moving the centering stage along the predetermined offset axis and the operation of rotating the centering stage are performed simultaneously.

4. The substrate processing method according to claim 2, further comprising: if the distance between the central axis of the processing stage and the central axis of the centering stage is longer than a distance between the central axis of the centering stage and the center of the substrate, lowering the centering stage to transfer the substrate from the centering stage to the processing stage; rotating the processing stage 180 degrees together with the substrate; and then elevating the centering stage to transfer the substrate from the processing stage to the centering stage.

5. The substrate processing method according to claim 2, wherein if the amount of eccentricity is larger than a maximum distance that the centering stage can be moved along the predetermined offset axis, the centering stage is moved and rotated until a distance between the center of the substrate on the centering stage and the central axis of the processing stage reaches a minimum.

6. The substrate processing method according to claim 1, wherein the centering stage is moved in a direction which can minimize a time to complete the centering operation, and wherein the direction in which the centering stage is moved is determined in advance based on a positional relationship between the central axis of the centering stage, the central axis of the processing stage and the center of the substrate on the centering stage.

7. The substrate processing method according to claim 1, wherein the centering stage is moved only in one direction and rotated only in one direction in the centering operation.

8. The substrate processing method according to claim 1, further comprising:
- after performing of the centering operation, lowering the centering stage and the substrate until the substrate is brought into contact with the processing stage.

9. The substrate processing method according to claim 1, wherein processing the substrate comprises processing the substrate while rotating the processing stage about its central axis and while pressing a processing tool against the substrate.

10. The substrate processing method according to claim 9, wherein processing the substrate comprises polishing the substrate, and the processing tool comprises a polishing tool.

11. The substrate processing method according to claim 9, wherein:
- the second area of the lower surface of the substrate comprises a peripheral area of the lower surface of the substrate; and
- pressing a processing tool against the substrate comprises pressing a processing tool against a peripheral portion of the substrate.

12. The substrate processing method according to claim 11, wherein pressing the processing tool against the peripheral portion of the substrate comprises pressing the processing tool against a peripheral area of an upper surface of the substrate.

* * * * *